United States Patent
Song et al.

(10) Patent No.: US 12,274,130 B2
(45) Date of Patent: *Apr. 8, 2025

(54) LIGHT EMITTING DISPLAY DEVICE ENSURING UNIFORM DISPLAY QUALITY IN EXPANDED DISPLAY AREA

(71) Applicant: Samsung Display Co., LTD., Yongin-si (KR)

(72) Inventors: Hee Rim Song, Seoul (KR); Byung Chang Yu, Seosan-si (KR); Gyung Soon Park, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/228,078

(22) Filed: Jul. 31, 2023

(65) Prior Publication Data

US 2023/0413608 A1    Dec. 21, 2023

Related U.S. Application Data

(63) Continuation of application No. 17/588,734, filed on Jan. 31, 2022, now Pat. No. 11,765,940.

(30) Foreign Application Priority Data

Jun. 4, 2021 (KR) ........................ 10-2021-0072793

(51) Int. Cl.
*G09G 3/3233* (2016.01)
*H10K 59/121* (2023.01)
*H10K 59/131* (2023.01)

(52) U.S. Cl.
CPC ....... *H10K 59/1216* (2023.02); *G09G 3/3233* (2013.01); *G09G 2300/0408* (2013.01); *G09G 2300/0426* (2013.01); *G09G 2300/0842* (2013.01); *G09G 2310/0243* (2013.01); *G09G 2310/08* (2013.01); *H10K 59/131* (2023.02)

(58) Field of Classification Search
CPC .......... G09G 3/30; G09G 3/32; G09G 3/3208; G09G 3/3216; G09G 3/3225; G09G 3/3233; G09G 3/3241; G09G 3/325; G09G 3/3258; G09G 3/3266; G09G 3/3275;

(Continued)

(56) References Cited

U.S. PATENT DOCUMENTS

| 9,887,256 | B2 | 2/2018 | Kim et al. |
| 11,765,940 | B2 * | 9/2023 | Song ..................... G09G 3/035 345/691 |

(Continued)

FOREIGN PATENT DOCUMENTS

| KR | 100635511 B1 | 10/2006 |
| KR | 1020170136128 A | 12/2017 |
| KR | 1020180018960 A | 2/2018 |

*Primary Examiner* — Ke Xiao
*Assistant Examiner* — Nelson Lam
(74) *Attorney, Agent, or Firm* — CANTOR COLBURN LLP

(57) ABSTRACT

A light emitting display device includes: a first display area including a first light-emitting element and a first pixel circuit unit; and a second display area including a second light-emitting element disposed to overlap a driving unit and a second pixel circuit unit which drives the second light-emitting element, where the first pixel circuit unit further include a first boost capacitor.

20 Claims, 23 Drawing Sheets

(58) Field of Classification Search
CPC ............... G09G 3/3283; G09G 3/3291; G09G 2300/0426; G09G 2300/0439
USPC ..................................................... 345/76–83
See application file for complete search history.

(56) References Cited

U.S. PATENT DOCUMENTS

| | | | |
|---|---|---|---|
| 12,142,222 B2* | 11/2024 | Lee | G09G 3/3291 |
| 2004/0227703 A1* | 11/2004 | Lamvik | G09G 3/3233 |
| | | | 348/E5.145 |
| 2008/0252217 A1* | 10/2008 | Kim | G09G 3/3233 |
| | | | 315/51 |
| 2010/0177024 A1 | 7/2010 | Choi | |
| 2012/0038608 A1 | 2/2012 | Seo et al. | |
| 2014/0098078 A1* | 4/2014 | Jeon | H10K 59/1216 |
| | | | 345/82 |
| 2015/0130868 A1 | 5/2015 | Feng | |
| 2015/0228223 A1 | 8/2015 | Park | |
| 2016/0035283 A1 | 2/2016 | Park et al. | |
| 2016/0133187 A1 | 5/2016 | Li et al. | |
| 2016/0189609 A1 | 6/2016 | Seo et al. | |
| 2016/0203794 A1* | 7/2016 | Lim | G09G 3/3225 |
| | | | 345/77 |
| 2016/0225318 A1* | 8/2016 | Choi | G09G 3/3258 |
| 2020/0227502 A1* | 7/2020 | Song | H10K 50/818 |
| 2021/0202638 A1* | 7/2021 | Park | H10K 59/131 |
| 2023/0086400 A1* | 3/2023 | Hyeon | G09G 3/3233 |
| | | | 345/76 |
| 2024/0379045 A1* | 11/2024 | Zhang | G09G 3/32 |

\* cited by examiner

LIGHT EMITTING DISPLAY DEVICE ENSURING UNIFORM DISPLAY QUALITY IN EXPANDED DISPLAY AREA

This application is a continuation of U.S. patent application Ser. No. 17/588,734, filed on Jan. 31, 2022, which claims priority to Korean Patent Application No. 10-2021-0072793, filed on Jun. 4, 2021, all the benefits accruing therefrom under 35 U.S.C. § 119, the content of which in its entirety is herein incorporated by reference.

BACKGROUND

1. Field

The disclosure relates to a light emitting display device, and in detail, relates to a light emitting display device in which a light-emitting element is disposed on a driving unit.

2. Description of the Related Art

The display device may include a display area on which an image is displayed and a peripheral area on which no image is displayed. In the display area, a plurality of pixels may be disposed in a row direction and a column direction. In each pixel, various elements such as transistors, capacitors, etc., and various wires that may supply signals to the various elements may be provided. In the peripheral area, various driving units (e.g., a scan driver, a data driver, a timing controller, etc.) and wires for transmitting electrical signals for driving the pixels may be disposed.

SUMMARY

While it is desired to reduce the size of a peripheral area and to expand the display area, in a display device having high resolution and high-speed driving, the area occupied with the driving unit is increased such that it may be difficult to reduce the size of the peripheral area.

Embodiments are to provide a display device of which the display area is extended. Embodiments are to ensure uniform display quality in the display device having the expanded display area.

According to an embodiment, a light emitting display device includes: a first display area including a first light-emitting element and a first pixel circuit unit; and a second display area including a second light-emitting element disposed to overlap a driving unit and a second pixel circuit unit which drives the second light-emitting element, where the first pixel circuit unit further include a first boost capacitor.

In an embodiment, each of the first pixel circuit unit and the second pixel circuit unit may include: a first transistor which generates an output current, where the first transistor is a driving transistor; a second transistor which receives a data voltage from a data line; and a third transistor which transmits the data voltage output from the second transistor to the gate electrode of the first transistor.

In an embodiment, one electrode of the first boost capacitor may be connected to a first scan line connected to a gate electrode of the second transistor, and another electrode of the first boost capacitor may be connected to the gate electrode of the first transistor.

In an embodiment, each of the first pixel circuit unit and the second pixel circuit unit may further include a storage capacitor connected to the gate electrode of the first transistor.

In an embodiment, each of the first pixel circuit unit and the second pixel circuit unit may further include an input capacitor disposed between the second transistor and the third transistor.

In an embodiment, each of the first pixel circuit unit and the second pixel circuit unit may further include a fourth transistor which transmits a reference voltage to a terminal to which the input capacitor and the second transistor are connected.

In an embodiment, each of the first pixel circuit unit and the second pixel circuit unit may further include: a fifth transistor which transmits a driving voltage to the first transistor; and a sixth transistor which transmits the output current output from the first transistor to the first light-emitting element or the second light-emitting element.

In an embodiment, the first pixel circuit unit may further include a second boost capacitor including one terminal connected to the first scan line and another terminal connected to a node to which the first transistor and the sixth transistor are connected.

In an embodiment, the third transistor may include an oxide semiconductor.

In an embodiment, the first boost capacitor may include a first boost electrode overlapping the first scan line and disposed in a same layer as the oxide semiconductor.

In an embodiment, the third transistor may be turned on when a high level voltage is applied to the gate electrode, and the second transistor and the first transistor may be turned on when a low level voltage is applied to the gate electrode.

In an embodiment, each of the first pixel circuit unit and the second pixel circuit unit may further include a seventh transistor which applies an initialization voltage to an anode of the first light-emitting element or the second light-emitting element.

In an embodiment, the second display area may be disposed at opposing sides of the first display area, and the second light-emitting element included in the second display area may include a driving unit light-emitting element disposed on the driving unit which transmits a signal to the first pixel circuit unit and the second pixel circuit unit, and an intermediate light-emitting element disposed between the driving unit light-emitting element and the first light-emitting element.

In an embodiment, the second pixel circuit unit may be disposed under the intermediate light-emitting element, a part of the second pixel circuit unit may be connected to the driving unit light-emitting element, and the remaining part of the second pixel circuit unit may be connected to the intermediate light-emitting element.

In an embodiment, the driving unit may include: a first scan signal generator which generates a first scan signal; a second scan signal generator which generates a second scan signal; a first light-emission control signal generator which generates a first light-emission control signal; a second light-emission control signal generator which generates a second light-emission control signal; and an initialization control signal generator which generates a initialization control signal.

In an embodiment, the driving unit disposed at one side among the driving units disposed at the opposing sides of the first display area may include the first scan signal generator, the second scan signal generator, the first light-emission control signal generator, and the initialization control signal generator, and the driving unit positioned at the other side among the opposing sides of the first display area may include the first scan signal generator, the second scan signal generator, the first light-emission control signal generator, and the second light-emission control signal generator.

In an embodiment, the second scan signal generator, the first light-emission control signal generator, the second light-emission control signal generator, and the initialization control signal generator may be provided one by one per two pixel rows, and the first scan signal generator may be provided one by one for one pixel row.

In an embodiment, the first scan signal generator may output the first scan signal at an interval of one horizontal period (1H).

In an embodiment, the signal output from the second scan signal generator, the first light-emission control signal generator, the second light-emission control signal generator, and the initialization control signal generator may be output with an interval of two horizontal periods (2H).

In an embodiment, the first pixel circuit unit may have a width in a first direction which is about half of a width in the first direction of the second pixel circuit unit and have a same width in a second direction perpendicular to the first direction as a width in the second direction of the second pixel circuit unit.

According to embodiments, the display area may be expanded by positioning the light-emitting element on an upper portion of the driving unit.

According to embodiments, the structure of the pixel circuit unit that transmits the light-emission current to the light-emitting element on the driving unit and the structure of the normal pixel circuit unit are formed differently from each other to match the luminance of the light-emitting element on the driving unit, thereby the display quality of the light-emitting element on the driving unit may be equal or similar to the display quality of the normal light-emitting element, and as a result, the user may not recognize that the luminance difference in the display area.

DETAILED DESCRIPTION

Figure 1:
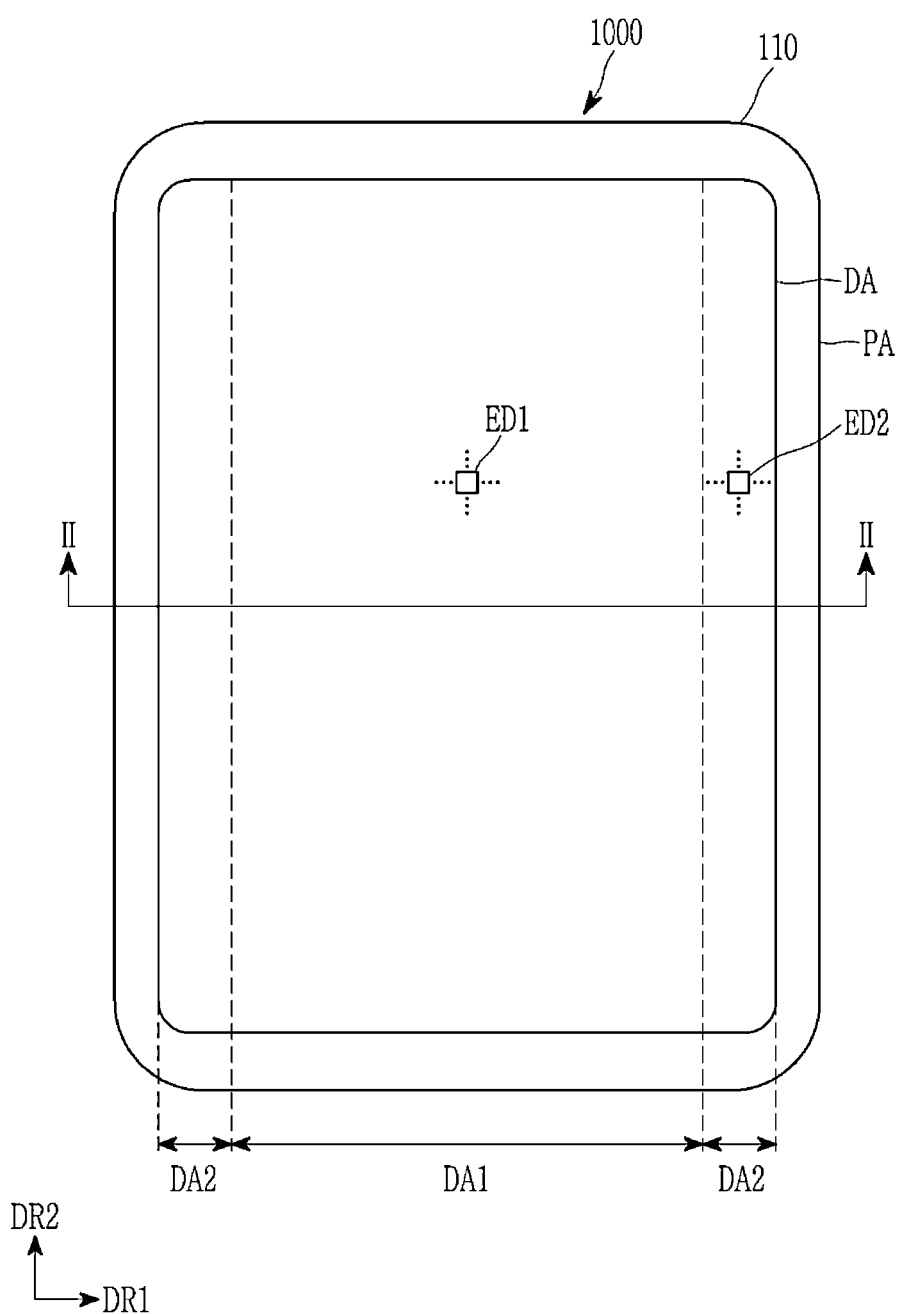
FIG. 1 is a top plan view of a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

Further, since magnitudes and thicknesses of constituent members shown in the accompanying drawings are arbitrarily given for better understanding and ease of description, the invention is not limited to the illustrated magnitudes and thicknesses. In the drawings, the thickness of layers, films, panels, regions, etc., are exaggerated for clarity. In the drawings, for better understanding and ease of description, the thicknesses of some layers and areas are exaggerated.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Further, in the specification, the phrase "on a plane" means when an object portion is viewed from above, and the phrase "on a cross-section" means when a cross-section taken by vertically cutting an object portion is viewed from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims Hereinafter, embodiments of the invention will be described in detail with reference to the accompanying drawings.

First, a display device according to an embodiment will be described with reference to FIG. 1 and FIG. 2.

Figure 2:
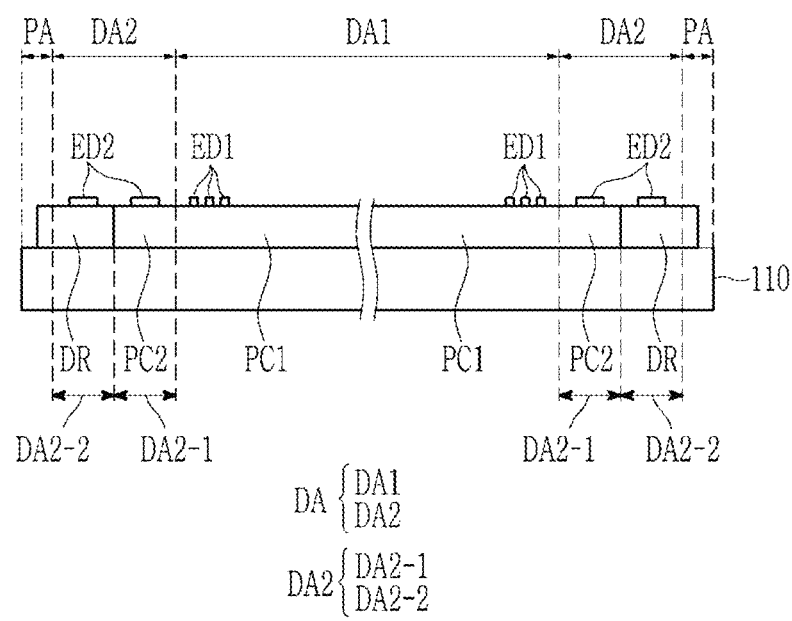
FIG. 2 is a cross-sectional view taken along line II-II of FIG. 1.

FIG. 1 is a top plan view of a display device according to an embodiment, and FIG. 2 is a cross-sectional view taken along line II-II of FIG. 1.

As shown in FIG. 1 and FIG. 2, an embodiment of a display device 1000 includes a substrate 110, pixel circuit units PC1 and PC2 (referring to FIG. 2) disposed on the substrate 110, and light-emitting elements ED1 and ED2 that receives a light-emission current from the pixel circuit units PC1 and PC2.

The substrate 110 includes a display area DA and a peripheral area PA adjacent to the display area DA. The display area DA may be positioned in the center of the display device 1000 and may have a substantially rectangular shape, and each corner may have a rounded shape. However, the shape of the display area DA and the shape of the corners are not limited thereto and may be variously changed or modified.

The display area DA may include a first display area DA1 and a second display area DA2 adjacent to the first display area DA1. In an embodiment, the first display area DA1 may be positioned in the center of the display area DA, and the second display area DA2 may be positioned on opposing sides of the first display area DA1, for example, the left side and the right side. However, this is only one embodiment, and the positions of the first display area DA1 and the second display area DA2 may be variously changed. In one alternative embodiment, for example, the first display area DA1 may be in an approximately quadrangle shape, and the second display area DA2 may be positioned to surround four corners of the first display area DA1.

The peripheral area PA may be in a shape surrounding the display area DA. The peripheral area PA is a region in which an image is not displayed, and may be positioned on the outer side of the display device. In an embodiment, the display device 1000 may include a bending part that is curved. In one embodiment, for example, the center portion of the display device 1000 may be flat, and the edge portion may have a curved shape. In such an embodiment, at least part of the second display area DA2 may be disposed in the bending part. In such an embodiment, at least part of the second display area DA2 of the substrate 110 may have the curved shape.

The light-emitting elements ED1 and ED2 may display a predetermined light or display a color in addition to luminance. In an embodiment, light-emitting elements ED1 and ED2 may emit light of red, green, and blue, or white. The display device 1000 may display a predetermined image through the light emitted from the light-emitting elements ED1 and ED2.

The light-emitting elements ED1 and ED2 may include a first light-emitting element ED1 and a second light-emitting element ED2. The light-emitting element ED1 and ED2 may be disposed in the display area DA.

The first light-emitting element ED1 may be positioned (or disposed) in the first display area DA1, and the second light-emitting element ED2 may be positioned in the second display area DA2. Referring to FIG. 2, the second light-emitting element ED2 may be disposed on (or to overlap) the driving unit DR. In an embodiment, the display device 1000 may include a plurality of first light-emitting elements ED1 and a plurality of second light-emitting elements ED2. A plurality of first light-emitting elements ED1 may be disposed in a matrix form along the first direction DR1 and the second direction DR2 in the first display area DA1, and a plurality of second light-emitting elements ED2 may be disposed in a matrix form along the first direction DR1 and the second direction DR2 in the second display area DA2. The magnitude of the first light-emitting element ED1 and the magnitude of the second light-emitting element ED2 may be the same as or different from each other. In one embodiment, for example, the magnitude of the second light-emitting element ED2 may be greater than the magnitude of the first light-emitting element ED1. The number of the first light-emitting elements ED1 per unit area and the number of the second light-emitting elements ED2 per unit area may be the same as or different from each other. In one embodiment, for example, the number of the second light-emitting elements ED2 per unit area may be less than the number of the first light-emitting elements ED1 per unit area. The resolution of the first display area DA1 and the resolution of the second display area DA2 may be the same as or different from each other. In one embodiment, for example, the resolution of the first display area DA1 may be higher than that of the second display area DA2. The arrangement shape and the magnitude of the first light-emitting element ED1 and the second light-emitting element ED2, and the resolution of the first display area DA1 and the second display area DA2, are not limited thereto and may be variously changed or modified.

Referring to FIG. 2, in an embodiment of the display device 1000 the pixel circuit units PC1 and PC2 positioned on the substrate 110 may include a first pixel circuit unit PC1 and a second pixel circuit unit PC2. In FIG. 2, the first pixel circuit unit PC1 represents a region where a plurality of first pixel circuit units PC1 are substantially disposed along the first direction DR1 and the second direction DR2, and the second pixel circuit unit PC2 represents a region where a plurality of second pixel circuit units PC2 are disposed substantially along the first direction DR1 and the second direction DR2. The arrangement shape of a plurality of pixel circuit units PC1 and PC2 is not particularly limited and may be arranged in various forms. The first pixel circuit unit PC1 may be positioned in the first display area DA1, and the second pixel circuit unit PC2 may be positioned in the second display area DA2. Each of the pixel circuit units PC1 and PC2 may be connected to at least one of light-emitting elements ED1 and ED2. The first pixel circuit unit PC1 may be connected to the first light-emitting element ED1, and the second pixel circuit unit PC2 may be connected to the second light-emitting element ED2. The size of one first pixel circuit unit PC1 and the size of one second pixel circuit unit PC2 may be the same as or different from. In one embodiment, for example, the size (or a planar area) of one second pixel circuit unit PC2 may be larger than the size of one first pixel circuit unit PC1. Also, the structure of the first pixel circuit unit PC1 and the structure of the second pixel circuit unit PC2 may have the partial different structures as shown in FIG. 4 and FIG. 5, and FIG. 7 to FIG. 20.

Figure 21:
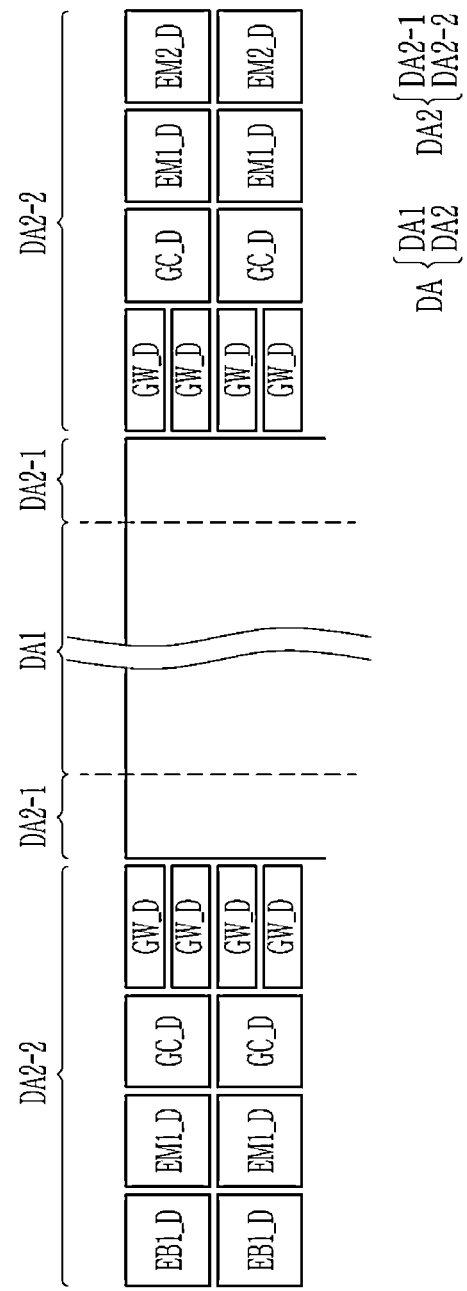
FIG. 21 is a block diagram showing a display device according to an embodiment.

Referring to FIG. 2, an embodiment of the display device 1000 may further include a driving unit DR positioned on the substrate 110. The driving unit DR may be connected to the first pixel circuit unit PC1 and the second pixel circuit unit PC2. The driving unit DR may include, for example, a signal generator such as a scan signal generator, a light-emission control signal generator, etc. and signal transmitting wires, etc. connected thereto. Referring to FIG. 21, the driving unit DR may include light-emission control signal generators EM1_D and EM2_D, an initialization control signal generator EB1_D, and scan signal generators GW_D and GC_D. In an embodiment, a data driver or a wire (a driving voltage supply line, a common voltage supply line, etc.) for transmitting a data voltage may be further included. At least part of the driving unit DR may be disposed in the second display area DA2, and the remaining part may be disposed in the peripheral area PA.

Referring back to FIG. 2, in the first display area DA1, light is emitted by the first light-emitting element ED1. In the first display area DA1, a first light-emitting element ED1 that receives a light-emission current from the first pixel circuit unit PC1 and the first pixel circuit unit PC1 is disposed or formed. In such an embodiment, at least part of the first light-emitting element ED1 may overlap the first pixel circuit unit PC1 electrically connected to the first light-emitting element ED1. Hereinafter, the sum of one first pixel circuit unit PC1 formed in the first display area DA1 and one first light-emitting element ED1 that receives the light-emission current therefrom is also referred to as a pixel or a normal pixel of the first display area. The first pixel circuit unit PC1 and the first light-emitting element ED1 are also referred to as a normal pixel circuit unit and a normal light-emitting element, respectively.

The second display area DA2 is a region in which light is emitted by the second light-emitting element ED2, and may be divided (or classified) into a first second display area DA2-1 and a second second display area DA2-2. The first second display area DA2-1 is a region where the second pixel circuit unit PC2 is positioned, and the second second display area DA2-2 is a region where the driving unit DR is positioned. The first second display area DA2-1 and the second second display area DA2-2 both include the second light-emitting element ED2 that receives the light-emission current from the second pixel circuit unit PC2. The second light-emitting element ED2 may be divided into the second light-emitting element ED2 positioned on the second pixel circuit unit PC2 and the second light-emitting element ED2 positioned on the driving unit DR. The second light-emitting element ED2 positioned on the driving unit DR defines the second second display area DA2-2, and receives the light-emission current from the part among the second pixel circuit unit PC2 positioned in the first second display area DA2-1. That is, the second pixel circuit unit PC2 may be divided into a second pixel circuit unit PC2 that transmits an output thereof to (or is connected to) the second light-emitting element ED2 in the first second display area DA2-1 and the second pixel circuit unit PC2 that transmits an output thereof to the second light-emitting element ED2 in the second second display area DA2-2. Hereinafter, the sum of one second pixel circuit unit PC2 defined in the second display area DA21 and one second light-emitting element ED2 that receives the light-emission current is referred to as a pixel or variation pixel of the second display area. The second pixel circuit unit PC2 is referred to as a variation pixel circuit unit, the second light-emitting element ED2 positioned in the first second display area DA2-1 is referred to as a first second light-emitting element, and the light-emitting element ED2 positioned in the second second display area DA2-2 is referred to as a second second light-emitting element. Also, hereinafter, the first second light-emitting element is referred to as an intermediate light-emitting element, and the second second light-emitting element is referred to as a driving unit light-emitting element.

In a conventional display device, a pixel circuit unit and a light-emitting element are disposed in a display area, and a driving unit is positioned in a peripheral area surrounding the display area, but the light-emitting element is not positioned in the peripheral area. Accordingly, the image may not be displayed in the peripheral area where the driving unit is positioned, and a dead space is formed. In an embodiment of the display device according to the invention, the driving unit light-emitting element among the second light-emitting elements ED2 is disposed in the portion where the driving unit DR is positioned, so that the image may be displayed, such that that the display area where an image is displayed is expanded. In such an embodiment, by positioning the second light-emitting element ED2 on the driving unit DR, the dead space may be reduced and the region in which the image is not displayed is reduced.

Hereinafter, the connection relation of the pixel circuit units PC1 and PC2 and the light-emitting elements ED1 and ED2 in the first display area DA1 and the second display area DA2 in the display device 1000 according to an embodiment will be described in detail with reference to FIG. 3.

Figure 3:
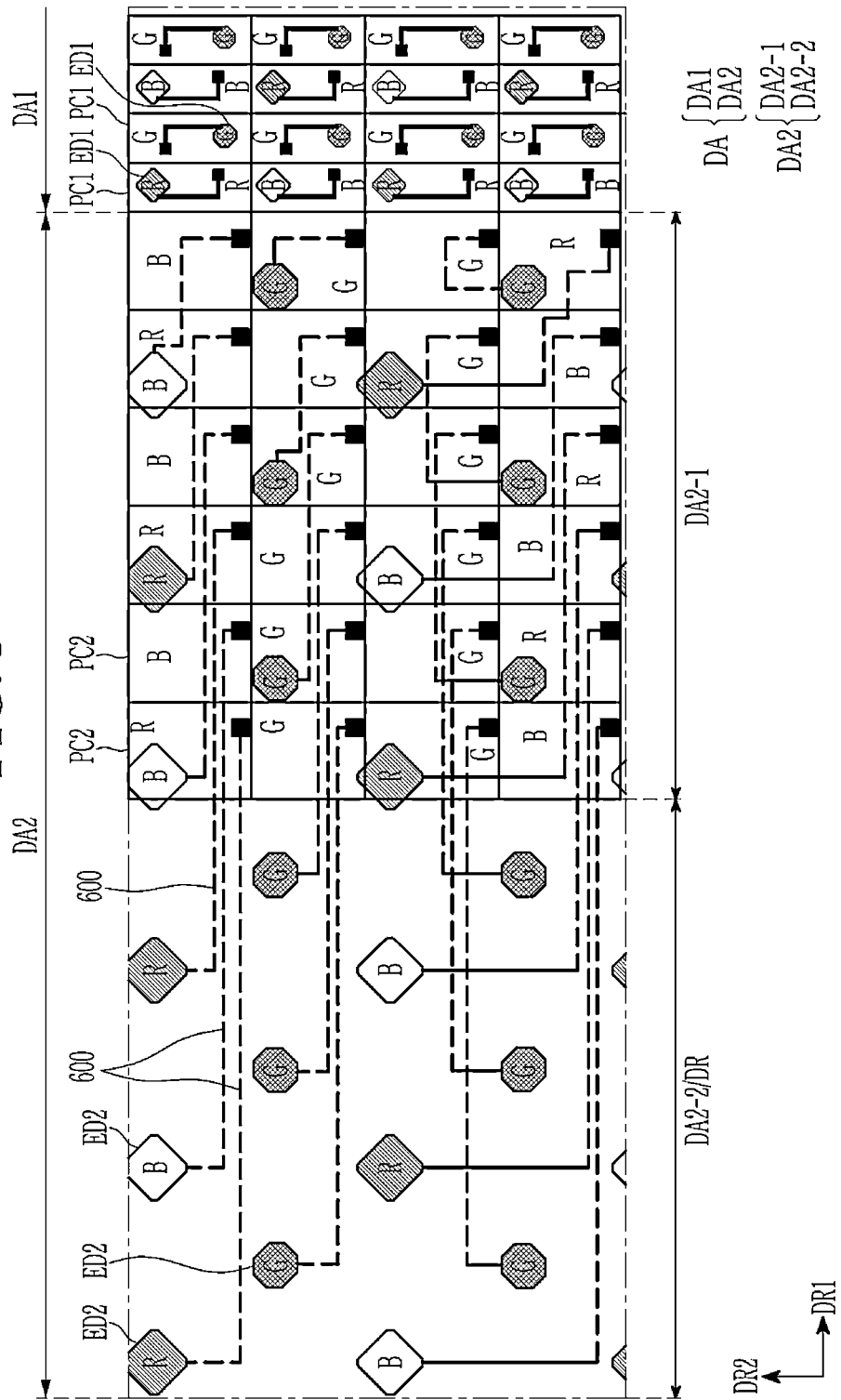
FIG. 3 is a top plan view showing a connection relationship between a pixel circuit unit and a light-emitting element in a display device according to an embodiment.

FIG. 3 is a top plan view showing a connection relationship between a pixel circuit unit and a light-emitting element in a display device according to an embodiment.

First, referring to the first display area DA1, as shown in FIG. 3, the first light-emitting element ED1 of the display device according to an embodiment overlaps at least part of the first pixel circuit unit PC1 that transmits the light-emission current to the first light-emitting element ED1.

In the first display area DA1, the first pixel circuit unit PC1 is disposed in a matrix form along the first direction DR1 and the second direction DR2, and the first light-emitting element ED1 is arranged according to the arrangement method of the first pixel circuit unit PC1. Referring to FIG. 3, in an embodiment, the first pixel circuit unit PC1 positioned in the first row and the first column is connected to and overlaps the first light-emitting element ED1 positioned in the first row and the first column. In such an embodiment, the first pixel circuit unit PC1 positioned in the first row and the second column is connected to and overlaps the first light-emitting element ED1 disposed in the first row and the second column. In such an embodiment, the first pixel circuit unit PC1 positioned in the second row and the first column is connected to and overlaps the first light-emitting element ED1 positioned in the second row and the first column. In such an embodiment, the first pixel circuit unit PC1 positioned in the second row and the second column is connected to and overlaps the first light-emitting element ED1 positioned in the second row and the second column. In an embodiment, each first light-emitting element ED1 may display at least any one among a first color, a second color, a third color. In one embodiment, for example, the first light-emitting element ED1 may display red (R), green (G), or blue (B). In such an embodiment, in the first row and the third row, the first light-emitting element ED1 that displays red (R), the first light-emitting element ED1 that displays green (G), the first light-emitting element ED1 that displays blue (B), and the first light-emitting element ED1 that displays green (G) may be repeatedly disposed. In the second row and the fourth row, the first light-emitting element ED1 that displays blue (B), the first light-emitting element ED1 that displays green (G), the first light-emitting element ED1 that displays red (R), and the first light-emitting element ED1 that displays green (G) may be repeatedly disposed.

The connection and arrangement methods of the first light-emitting element ED1 and the first pixel circuit unit PC1 in the first display area DA1 are hereinafter also referred to as a normal connection method and a normal arrangement method, respectively.

In an embodiment, referring to the second display area DA2, as shown in FIG. 3, the second display area DA2 may be divided into a first second display area DA2-1 and a second second display area DA2-2. The first second display area DA2-1 is a region where the second pixel circuit unit PC2 is positioned, and the second second display area DA2-2 is a region where the driving unit DR is positioned. The second light-emitting element ED2 that receives the light-emission current from the second pixel circuit unit PC2 is positioned above the second pixel circuit unit PC2 and above the driving unit DR. The second light-emitting element ED2 is divided into a second light-emitting element ED2 positioned above (or disposed on and to overlap) the second pixel circuit unit PC2 and a second light-emitting element ED2 positioned above the driving unit DR. The second light-emitting element ED2 (an intermediate light-emitting element) positioned above the second pixel circuit unit PC2 defines the first second display area DA2-1, and the second light-emitting element ED2 (the driving unit light-emitting element (ED2)) positioned above the driving unit DR defines the second second display area DA2-2. The second pixel circuit unit PC2 is divided into the second pixel circuit unit PC2 (hereinafter referred to as a pixel circuit unit for the intermediate light-emitting element) that transmits an output thereof to the second light-emitting element ED2 (an intermediate light-emitting element) configuring the first second display area DA2-1 and the second pixel circuit unit PC2 (hereinafter referred to as a pixel circuit unit for the driving unit light-emitting element) that transmits an output thereof to the second light-emitting element ED2 (referred to as the driving unit light-emitting element) configuring the second second display area DA2-2. In an embodiment, the pixel circuit unit is not positioned in the second second display area DA2-2, but the pixel circuit unit has the structure in which the driving unit light-emitting element is emitted by receiving the light-emission current from a corresponding pixel circuit unit positioned in the adjacent first second display area DA2-1. In an embodiment, as shown in FIG. 3, the second pixel circuit unit PC2 positioned in the first row and the first column is connected to the second light-emitting element ED2 positioned in the first row and the first column, but does not overlap the second light-emitting element ED2 positioned in the first row and the first column. In such an embodiment, the driving unit light-emitting element among the second light-emitting elements ED2 may not overlap the second pixel circuit unit PC2 connected thereto in a plan view. In such an embodiment, the second light-emitting element ED2 and the second pixel circuit unit PC2 that do not overlap each other and are spaced apart from each other may be connected by an extension wire 600. In an embodiment, the intermediate light-emitting element among some second light-emitting elements ED2 may overlap the second pixel circuit unit PC2 that is not connected thereto in a plan view. Referring to FIG. 3, in an embodiment, the light emission region of the second light-emitting element ED2 positioned in the first row and the fourth column may overlap the second pixel circuit unit PC2 positioned in the first row and the first column. In such an embodiment, the light emission region of the second light-emitting element ED2 positioned in the first row and the fifth column may overlap the second pixel circuit unit PC2 positioned in the first row and the third column. In such an embodiment, the light emission region of the second light-emitting element ED2 positioned in the first row and the sixth column may overlap the second pixel circuit unit PC2 positioned in the first row and the fifth column.

In the first second display area DA2-1, the second pixel circuit unit PC2 is disposed in a matrix form along the first direction DR1 and the second direction DR2, and the second light-emitting element ED2 positioned in the first second display area DA2-1 and the second second display area DA2-2 may have the arrangement similar to that of the first light-emitting element ED1 positioned in the first display area DA1.

Referring to FIG. 3, in an embodiment, the planar area occupied by the first pixel circuit unit PC1 positioned in the first display area DA1 may be about half of the area occupied by the second pixel circuit unit PC2 positioned in the first second display area DA2-1. In an embodiment, the area occupied by the second pixel circuit unit PC2 positioned in the first second display area DA2-1 is larger than the area occupied by the normal pixel circuit unit, and may have an area of about 2 times or more and about 4 times or less thereof. In an alternative embodiment, the area occupied by the second pixel circuit unit PC2 and the area occupied by the normal pixel circuit unit may be approximately the same as each other.

Also, referring to FIG. 3, the planar area of the first light-emitting element ED1 positioned in the first display area DA1 may be smaller than the planar area of the second light-emitting element ED2 positioned in the second display area DA2. According to an embodiment, the area of the second light-emitting element ED2 may be greater than or equal to one time and less than or equal to twice the area of the first display area DA1.

Each second light-emitting element ED2 may display at least one of a first color, a second color, and a third color. In one embodiment, for example, the second light-emitting element ED2 may display red (R), green (G), or blue (B). In such an embodiment, the second light-emitting element ED2 that displays red (R) and the second light-emitting element ED2 displaying blue (B) may be repeatedly disposed in the first and third rows. In the second row and the fourth row, the second light-emitting element ED2 that displays green (G) may be disposed.

In an embodiment of the display device according to the invention, the second light-emitting element ED2 is positioned not only in the region in which the second pixel circuit unit PC2 is positioned but also in the region in which the driving unit DR is positioned, so that the region in which the screen is displayed may be expanded. Accordingly, the pixel density in the second display area DA2 may be relatively lower than the pixel density in the first display area DA1. In such an embodiment, the size of the second light-emitting element ED2 may be increased to increase the luminance of the second light-emitting element ED2 to compensate for the decreased pixel density. Accordingly, the magnitude of each element such as the storage capacitor included in the second pixel circuit unit PC2 may be formed to be large to supply more current to the second light-emitting element ED2. In such an embodiment, the area occupied by the second pixel circuit unit PC2 may be widened. However, this is only one embodiment, and the areas of the second pixel circuit unit PC2 and the second light-emitting element ED2 may be set or modified in various ways.

Figure 4:
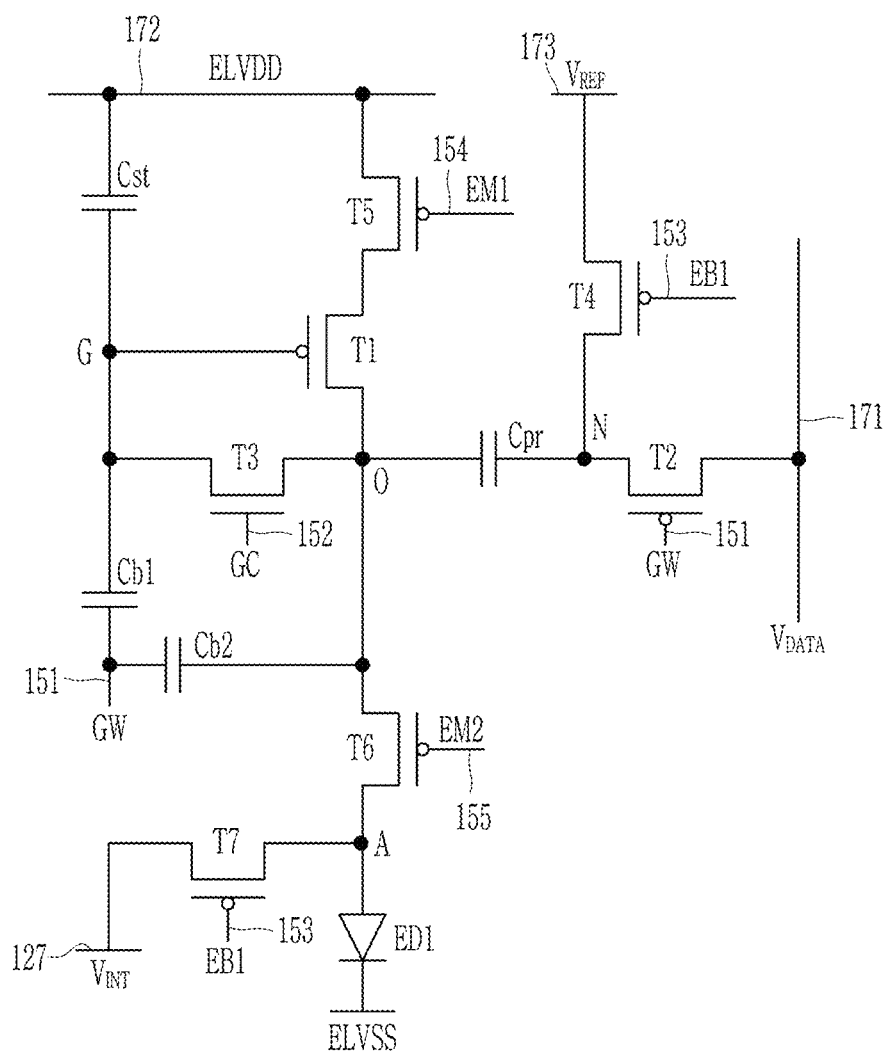
FIG. 4 is a circuit diagram of a pixel of a first display area according to an embodiment.
Figure 5:
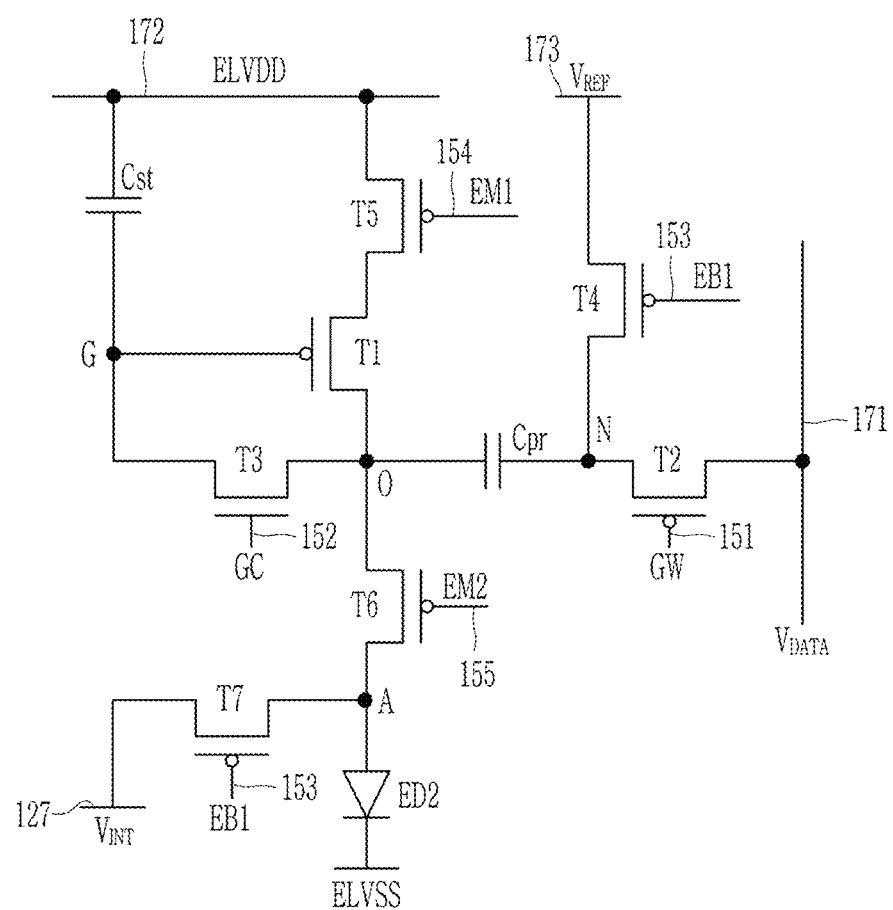
FIG. 5 is a circuit diagram of a pixel of a second display area according to an embodiment.

The normal pixel PC1 (and ED1) of the first display area DA1, and the variation pixel PC2 (and ED2) of the second display area DA2, having the structure as described above, may have different circuit structures from each other as shown in FIG. 4 and FIG. 5.

Next, the circuit structure of the normal pixel PC1 (and ED1) of the first display area DA1 will be described in detail with reference to FIG. 4.

FIG. 4 is a circuit diagram of a pixel of a first display area according to an embodiment.

In an embodiment, the normal pixel of the first display area DA1 includes the pixel circuit unit PC1 and the light-emitting element ED1, and in FIG. 4, the remaining components except for the light-emitting element ED1 constitute or collectively define the pixel circuit unit PC1. The pixel circuit unit may include: a driving transistor T1 that transmits the light-emission current to the anode of the light-emitting element ED1; a second transistor T2 connected to the data line 171 and that transmits a data voltage to an input capacitor; and a third transistor T3 connected to a gate electrode and an output electrode of the driving transistor T1, and may additionally include a boost capacitor Cb1 or Cb2. Here, one terminal of the boost capacitor Cb1 or Cb2 is connected to a first scan line 151 connected to a gate electrode of the second transistor T2.

In an embodiment as shown in FIG. 4, the normal pixel includes a plurality of transistors T1, T2, T3, T4, T5, T6, and T7, a plurality of capacitors Cst, Cpr, Cb1, and Cb2, and a light-emitting element ED1, which are connected to several signal lines 127, 151, 152, 153, 154, 155, 171, 172, and 173. In an embodiment, the light-emitting element may be an organic light emitting element or an inorganic light-emitting element.

A plurality of transistors T1, T2, T3, T4, T5, T6, and T7 include a driving transistor T1 (referred to as a first transistor) that generates the light-emission current to be transmitted to the light-emitting element ED1, a second transistor T2 for that transmits a data voltage $V_{DATA}$ applied to the data line 171 into the pixel, a third transistor T3 connected to the output electrode and the gate electrode of the driving transistor T1, a fourth transistor T4 which changes a voltage of one terminal of the input capacitor Cpr into a reference voltage $V_{REF}$, a fifth transistor T5 that transmits a driving voltage (or a first driving voltage) ELVDD to the driving transistor T1, a sixth transistor T6 that transmits the light-emission current of the driving transistor T1 to the light-emitting element ED1, and a seventh transistor T7 changes a voltage of the anode of the light-emitting element ED1 into an initialization voltage $V_{INT}$. According to an embodiment, an additional transistor for that transmits a bias voltage to the input electrode of the driving transistor T1 may be further included. The cathode of the light-emitting element ED1 is connected to another driving voltage (or a second driving voltage) ELVSS.

A plurality of signal lines 127, 151, 152, 153, 154, 155, 171, 172, and 173 may include a first scan line 151, a second scan line 152, an initialization control line 153, light emission control lines 154 and 155, a data line 171, a driving voltage line 172, a reference voltage line 173, and an initialization voltage line 127. The signals having different timings may be applied to the first light emission control line 154 and the second light emission control line 155 included in the light emission control lines 154 and 155.

The reference voltage line 173 transmits a reference voltage $V_{REF}$ to a node N to which the input capacitor Cpr and the second transistor T2 are connected, the driving voltage line 172 transmits the driving voltage ELVDD to the driving transistor T1, and the initialization voltage line 127 transmits the initialization voltage $V_{INT}$ to the anode of the light-emitting element ED1.

A plurality of capacitors Cst, Cpr, Cb1, and Cb2 include a storage capacitor Cst for constantly maintaining the voltage of the gate electrode of the driving transistor T1 during one frame, an input capacitor Cpr for that transmits the data voltage $V_{DATA}$ transmitted through the second transistor T2 to one electrode of the driving transistor T1, and boost capacitors Cb1 and Cb2 for changing the voltages of a node G and a node O by the first scan signal GW. According to an alternative embodiment, the input capacitor Cpr is omitted, and the data voltage $V_{DATA}$ may be directly transferred to one electrode of the driving transistor T1. In an alternative embodiment, only one of two boost capacitors Cb1 and Cb2 may be included.

The connection relationship of each element included in the pixel will hereinafter described in detail.

The driving transistor T1 is a transistor for adjusting the magnitude of the current output based on the data voltage $V_{DATA}$ to the gate electrode, and the output current is applied to the anode of the light-emitting element ED1, thereby adjusting the brightness of the light-emitting element ED1 based on the data voltage $V_{DATA}$. In such an embodiment, the first electrode of the driving transistor T1 is connected to the driving voltage line 172 via the fifth transistor T5 to receive the driving voltage ELVDD. In such an embodiment, the second electrode (the node O) of the driving transistor T1 is connected to output the light-emission current toward the light-emitting element and is connected to the anode of the light-emitting element ED1 via the sixth transistor T6. The second electrode of the driving transistor T1 is connected to the input capacitor Cpr to receive the data voltage $V_{DATA}$ input through the second transistor T2. In such an embodiment, the gate electrode (a node G) of the driving transistor T1 is connected to the storage capacitor Cst. Accordingly, the voltage of the gate electrode of the driving transistor T1 changes based on the voltage stored in the storage capacitor Cst, and the current output by the driving transistor T1 changes accordingly. The gate electrode and the second electrode of the driving transistor T1 are connected to each other by the third transistor T3. The gate electrode (the node G) of the driving transistor T1 is also connected to one terminal of the first boost capacitor Cb1. The other terminal of the first boost capacitor Cb1 is connected to the first scan line 151, thereby having a function of compensating the voltage of the gate electrode (the node G) of the driving transistor T1 by the first scan signal GW applied to the first scan line 151. The second electrode (the node O) of the driving transistor T1 is also connected to the second boost capacitor Cb2. The other terminal of the second boost capacitor Cb2 is connected to the first scan line 151 so that the data voltage $V_{DATA}$ transmitted to the node O is compensated and transmitted by the first scan signal GW applied to the first scan line 151.

Here, the compensation may mean compensating the rising or falling of the voltage value of the node G and the node O at a rising edge where the second scan signal GC applied to the second scan line 152 is changed to a high voltage to turn on the third transistor T3, or at a falling edge where the second scan signal GC applied to the second scan line 152 is changed to a low voltage again, and for this purpose, it is compensated by using the first scan signal GW applied first scan line 151 and the boost capacitors Cb1 and Cb2. According to an embodiment, only one of two boost capacitors Cb1 and Cb2 may be included.

The second transistor T2 is a transistor that receives the data voltage $V_{DATA}$ into the pixel (the node N of FIG. 4). The gate electrode of the second transistor T2 is connected to the first scan line 151, and the first electrode of the second transistor T2 is connected to the data line 171. The second electrode of the second transistor T2 is connected to the second electrode (the node O) of the driving transistor T1 through the input capacitor Cpr. When the second transistor T2 is turned on according to the first scan signal GW transmitted through the first scan line 151, the data voltage $V_{DATA}$ transmitted through the data line 171 is transmitted to the second electrode of the driving transistor T1 through the input capacitor Cpr.

The third transistor T3 serves to transfer the data voltage $V_{DATA}$ to the gate electrode of the driving transistor T1 and the storage capacitor Cst, and also to be stored while compensating the threshold voltage of the driving transistor T1 for the voltage stored in the storage capacitor Cst. In an embodiment, the third transistor T3 may be an n-type transistor including an oxide semiconductor, unlike other transistors T1, T2, T4, T5, T6, and T7 that are a p-type transistor including a polycrystalline semiconductor. As a result, a low voltage is to be applied to the gate electrode to turn on the other transistors T1, T2, T4, T5, T6, and T7, but a high voltage is to be applied to the gate electrode to turn on the third transistor T3. The gate electrode of the third transistor T3 is connected to the second scan line 152, the first electrode of the third transistor T3 is connected to the node O to be connected to the second electrode of the driving transistor T1 and the input capacitor Cpr, and the second electrode of the third transistor T3 is connected to the node G to be connected to the gate electrode of the driving transistor T1 and the storage capacitor Cst. In such an embodiment, by diode-connecting the driving transistor T1, when the driving transistor T1 is turned on by the voltage applied to the storage capacitor Cst, as the negative charge stored in the storage capacitor Cst escapes, the voltage of the storage capacitor Cst increases. Then, the driving transistor T1 is turned off at the threshold voltage of the driving transistor T1 and the voltage is no longer reduced, so the voltage stored in the storage capacitor Cst becomes the threshold voltage of the driving transistor T1. With this structure, even if each driving transistor T1 has the different threshold voltage, the pixel circuit unit may be compensated and operated, respectively. In an embodiment, the second electrode of the third transistor T3 is also connected to one terminal of the first boost capacitor Cb1. The other terminal of the first boost capacitor Cb1 is connected to the first scan line 151 and serves to lower the voltage of the gate electrode (the node G) of the driving transistor T1 by the first scan signal GW applied to the first scan line 151. In an embodiment, the first electrode of the third transistor T3 is also connected to one terminal of the second boost capacitor Cb2. The other terminal of the second boost capacitor Cb2 is connected to the first scan line 151, so that the data voltage $V_{DATA}$ transmitted to the node O by the first scan signal GW applied to the first scan line 151 may be transmitted as a lower value.

The fourth transistor T4 serves to initialize the voltage of the first electrode of the input capacitor Cpr (or the second electrode of the second transistor T2) into the reference voltage $V_{REF}$. The gate electrode of the fourth transistor T4 is connected to the initialization control line 153, the first electrode of the fourth transistor T4 is connected to the reference voltage line 173, and the second electrode of the fourth transistor T4 is connected to the first electrode of the input capacitor Cpr and the second electrode of the second transistor T2.

The fifth transistor T5 serves to transfer the driving voltage ELVDD to the driving transistor T1. The gate electrode of the fifth transistor T5 is connected to the first light emission control line 154, the first electrode of the fifth transistor T5 is connected to the driving voltage line 172, and the second electrode of the fifth transistor T5 is connected to the first electrode of the driving transistor T1.

The sixth transistor T6 serves to transfer the light-emission current output from the driving transistor T1 to the light-emitting element. The gate electrode of the sixth transistor T6 is connected to the second light emission control line 155, the first electrode of the sixth transistor T6 is connected to the second electrode (the node O) of the driving transistor T1, and the second electrode of the sixth transistor T6 is connected to the anode of the light-emitting element. In an embodiment, the first electrode of the sixth transistor T6 is also connected to one terminal of the second boost capacitor Cb2. The other terminal of the second boost capacitor Cb2 is connected to the first scan line 151 and serves to lower the voltage of the node O by the first scan signal GW applied to the first scan line 151.

The seventh transistor T7 initializes the anode of the light-emitting element into the initialization voltage $V_{INT}$. The gate electrode of the seventh transistor T7 is connected to the initialization control line 153, the first electrode of the seventh transistor T7 is connected to the anode of the light-emitting element (the node A), and the second electrode of the seventh transistor T7 is connected to the initialization voltage line 127.

The first storage electrode of the storage capacitor Cst is connected to the driving voltage line 172, and the second storage electrode is connected to the node G, that is, the gate electrode of the driving transistor T1, the second electrode of the third transistor T3, and the first boost capacitor Cb1. As a result, the voltage of the second storage electrode is equal to the voltage of the gate electrode of the driving transistor T1, and the voltage of the gate electrode of the driving transistor T1 is maintained constant for one frame. Also, the voltage of the gate electrode of the driving transistor T1 is lowered to the lower voltage by the first boost capacitor Cb1, so that the turn on characteristic of the driving transistor T1 is improved.

The first electrode of the input capacitor Cpr is connected to the node N, that is, the second electrode of the second transistor T2 and the second electrode of the fourth transistor, and the second electrode is connected to the second electrode (the node O) of the driving transistor T1. Also, the second electrode of the input capacitor Cpr is connected to the second boost capacitor Cb2 through the node O. Since the second boost capacitor Cb2 and the second transistor T2 are both connected to the first scan line 151, the data voltage $V_{DATA}$ transmitted to the node O by the first scan signal GW may be transmitted as a lower value.

In an embodiment, the first electrode of the first boost capacitor Cb1 is connected to the node G, that is, the gate electrode of the driving transistor T1 and the second electrode of the third transistor T3, and the second electrode is connected to the first scan line 151. The first boost capacitor Cb1 serves to change the voltage of the gate electrode (the node G) of the driving transistor T1 based on the first scan signal GW.

The first electrode of the second boost capacitor Cb2 is connected to node O, that is, the second electrode of the driving transistor T1, the first electrode of the third transistor T3, the second electrode of the second transistor T2, and the first electrode of the sixth transistor T6, and the second electrode is connected to the first scan line 151. The second boost capacitor Cb2 allows the data voltage $V_{DATA}$ transmitted to the node O by the first scan signal GW to be transmitted while being compensated.

The first boost capacitor Cb1 and the second boost capacitor Cb2 compensate the voltages of the node G and the node O, such that the voltage values of the node G and the node O are compensated to be increased or decreased at a rising edge when the second scan signal GC applied to the second scan line 152 connected to the gate electrode of the third transistor T3 is changed to a high voltage to turn on the third transistor or at a falling edge when the second scan signal G is changed to a low voltage again.

In an embodiment, the normal pixel of the first display area DA1 may have the circuit structure described above with reference to FIG. 4.

Hereinafter, the circuit structure of the variation pixels PC2 (and ED2) of the second display area DA2 will be described in detail with reference to FIG. 5 and differences will be focused on.

FIG. 5 is a circuit diagram of a pixel of a second display area accord to an embodiment.

The normal pixel of the second display area DA2 includes the pixel circuit unit PC2 and the light-emitting element ED2, and as shown in FIG. 5, the remaining components except for the light-emitting element ED2 may collectively define the pixel circuit unit PC2.

In an embodiment, the circuit structure of the second pixel circuit unit PC2 among the variation pixels PC2 (and ED2) may be different the first pixel circuit unit PC1. In an embodiment, referring to FIG. 5, the second pixel circuit unit PC2 does not include two boost capacitors Cb1 and Cb2 that are included in the first pixel circuit unit PC1. As a result, in the second pixel circuit unit PC2, the voltages of the node G and the node O may not further decrease additionally by the first scan signal GW.

In an embodiment, since the first boost capacitor Cb1 and the second boost capacitor Cb2 are omitted, the driving transistor T1 of the second pixel circuit unit PC2 is not connected to the first boost capacitor Cb1 and the second boost capacitor Cb2. In an embodiment, the second electrode (the node O) of the driving transistor T1 is connected to the input capacitor Cpr, the first electrode of the third transistor T3, and the first electrode of the sixth transistor T6, and the gate electrode (the node G) of the driving transistor T1 is connected to the storage capacitor Cst and the second electrode of the third transistor T3.

In an embodiment, since the first boost capacitor Cb1 and the second boost capacitor Cb2 are omitted, the third transistor T3 of the second pixel circuit unit PC2 is not connected to the first boost capacitor Cb1 and the second boost capacitor Cb2. In such an embodiment, the first electrode of the third transistor T3 is connected to the node O to be connected to the second electrode of the driving transistor T1, the input capacitor Cpr, and the first electrode of the sixth transistor T6, and the second electrode of the third transistor T3 is connected to the node G to be connected to the gate electrode of the driving transistor T1 and the storage capacitor Cst.

In an embodiment, since the first boost capacitor Cb1 and the second boost capacitor Cb2 are omitted, the sixth transistor T6 is also not connected to the second boost capacitor Cb2, and the first electrode of the sixth transistor T6 is connected to the second electrode of the driving transistor T1, the input capacitor Cpr, and the first electrode of the third transistor T3.

In an embodiment, since the first boost capacitor Cb1 and the second boost capacitor Cb2 are omitted, the storage capacitor Cst is also not connected to the first boost capacitor Cb1, and the input capacitor Cpr is also not connected to the second boost capacitor Cb2.

While the other terminals of the first boost capacitor Cb1 and the second boost capacitor Cb2 are connected to the first scan line 151 in the first pixel circuit unit PC1, the first scan line 151 may be disposed to not overlap other parts in the second pixel circuit unit PC2 where the first boost capacitor Cb1 and the second boost capacitor Cb2 are omitted. The arrangement structure of the second pixel circuit unit PC2 according to an embodiment will be described later withe reference to FIG. 14 to FIG. 20.

Hereinafter, a waveform diagram of the signals commonly applied to the pixel circuit units PC1 and PC2 of FIG. 4 and FIG. 5 will be described with reference to FIG. 6, and the operation of the normal pixel and the variation pixel based thereon will be described.

Figure 6:
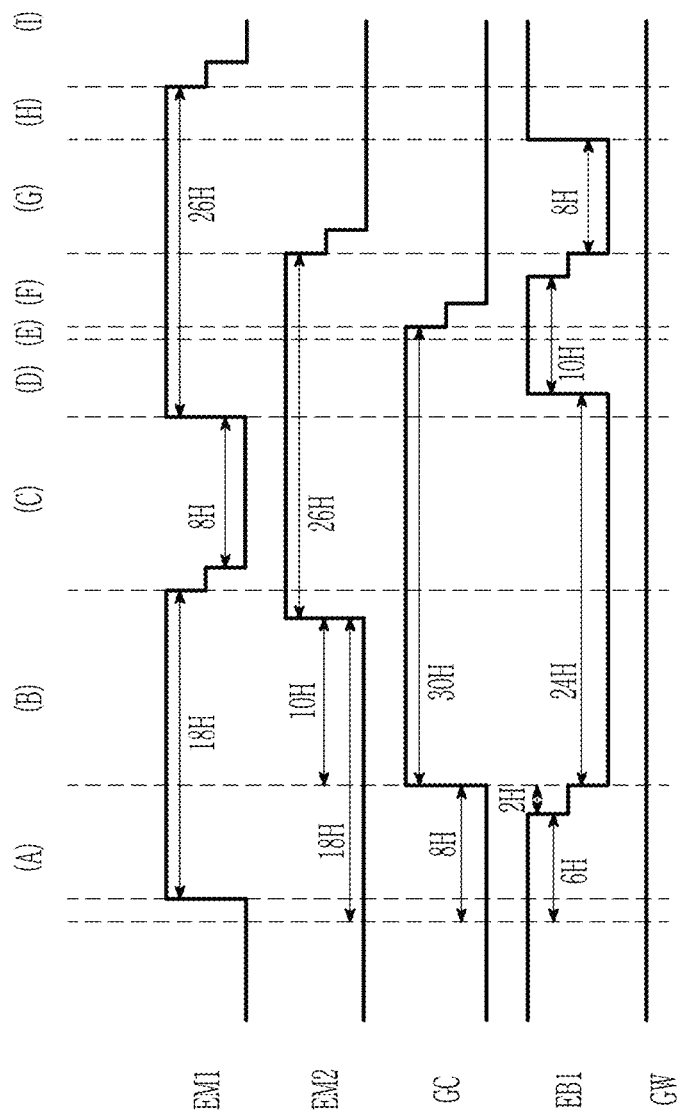
FIG. 6 is a waveform diagram of signals applied to a pixel according to embodiments of FIG. 4 and FIG. 5.

FIG. 6 is waveform diagram applied to a pixel according to an embodiment of FIG. 4 and FIG. 5.

In FIG. 6, a frame period may be divided into periods (A), (B), (C), (D), (E), (F), (G), (H), and (I), and the period (I) may be disposed before the period (A).

First, it is described from the period (I) (hereinafter, also referred to as a light emission period).

In the period (I), a first light-emission control signal EM1 and a second light-emission control signal EM2 applied to the fifth transistor T5 and the sixth transistor T6 are only applied as a turn-on voltage (a low level voltage). As a result, the fifth transistor T5 and the sixth transistor T6 are turned on so that the driving transistor T1 receives the driving voltage ELVDD and has the structure that is connected to the light-emitting elements ED1 and ED2. As a result, the light-emission current is generated based on the driving voltage ELVDD and the voltage (the voltage of the node G) of the gate electrode of the driving transistor T1, and the output current is transmitted to the light-emitting elements ED1 and ED2. A luminance is displayed based on the magnitude of the light-emission current transmitted from the light-emitting elements ED1 and ED2.

Next, while the first light-emission control signal EM1 is changed into a turn-off voltage (a high level voltage), the period (A) is entered (or starts). After the first light-emission control signal EM1 is first changed into the turn-off voltage (the high level voltage), after a predetermined period of a time (4H in FIG. 6) has elapsed, the initialization control signal EB1 is changed to the turn-on voltage (the low level voltage). Here, 1H denotes one horizontal period. In the period (A), while the driving voltage ELVDD is not applied to the driving transistor T1, the driving transistor T1 does not generate the light-emission current. In addition, the voltage of the node N (the second electrode of the second transistor T2 and the second electrode of the fourth transistor) is initialized to the reference voltage $V_{REF}$ by the fourth transistor T4, and the node A (the anode of the light-emitting element) is initialized into the initialization voltage $V_{INT}$ input through the seventh transistor T7. In the period (A), since the sixth transistor T6 is turned on, the initialization voltage $V_{INT}$ is transmitted to the node O through the node A to also initialize the node O. The node O is connected to the second electrode of the driving transistor T1, the first electrode of the third transistor T3, and the second electrode of the input capacitor Cpr, so the second electrode of the driving transistor T1, the first electrode of the third transistor T3, and the second electrode of the input capacitor Cpr are all initialized into the initialization voltage $V_{INT}$. Also, in the case of the normal pixel, since one electrode of the second boost capacitor Cb2 is also connected to the node O, one electrode of the second boost capacitor Cb2 is also initialized with the initialization voltage $V_{INT}$. In an embodiment, the period (A) maybe performed during 6H.

After the initialization control signal EB1 is changed to the turn-on voltage (the low level voltage), the second scan signal GC is changed to the turn-on voltage (the high level voltage) and the period (B) is entered. In the period (B), the third transistor T3 is turned on and the initialization voltage $V_{INT}$ applied to the node O is transmitted to the node G, and the node G is also initialized to the initialization voltage $V_{INT}$. The gate electrode of the driving transistor T1 and the second electrode of the storage capacitor Cst, which are connected to the node G, are also initialized with the initialization voltage $V_{INT}$. Also, in the case of the normal pixel, since one electrode of the first boost capacitor Cb1 is also connected to the node G, one electrode of the first boost capacitor Cb1 is also initialized with the initialization voltage $V_{INT}$. According to an embodiment, a change of the second scan signal GC may be repeated several times (for example, three times) with the voltage of the low level and the voltage of the high level additionally. According to an embodiment, the number of times that the second scan signal GC is changed to the low level voltage may vary, and at least one time or more may be sufficient before the next the light emission period (I). In an embodiment, the initialization may be performed for 10H.

While the second light-emission control signal EM2 is changed to the turn-off voltage (the high-level voltage), and then the first light-emission control signal EM1 is changed to the turn-on voltage (the low level voltage), the period (C) is entered. The period (C) is referred to as a threshold voltage compensation period, and in the period (C), since the first light-emission control signal EM1 and the second scan signal GC have the turn-on voltage, while the driving voltage ELVDD is applied to the driving transistor T1, the diode connection structure is formed by the third transistor T3. In an embodiment shown in FIG. 6, the third transistor T3 is an n-type transistor containing an oxide semiconductor and is turned on when the high level voltage is applied, but the remaining transistors T1, T2, T4, T5, T6, and T7 are a p-type transistor including a polycrystalline semiconductor and are turned on when the low level voltage is applied.

In such an embodiment, since the voltage of the node G is the initialization voltage $V_{INT}$ having the voltage value of the low level, the driving transistor T1 is turned on, and as the negative charge stored in the storage capacitor Cst escapes, the voltage of the storage capacitor Cst increases, and at the threshold voltage of the driving transistor T1, the driving transistor T1 is turned off. As a result, in the storage capacitor Cst, a voltage value (VELVDD-Vth) that is lower than the threshold voltage (Vth) of the driving transistor T1 based on the driving voltage ELVDD is stored in the node G. Meanwhile, in the period (C), the node N and the node A are continuously maintained at the reference voltage $V_{REF}$ and the initialization voltage $V_{INT}$ by the initialization control signal EB1. In an embodiment, the period (C) may be performed during 10H.

After that, the first light-emission control signal EM1 and the initialization control signal EB1 are changed to the turn-off voltage (the high level voltage) and the period (D) is entered. In the period (D), the operation for compensating the threshold voltage is finished, and the period (D) is a period for preparing the subsequent period (E) (also referred to as a data writing period).

After that, while the first scan signal GW is changed to the turn-on voltage (the low level voltage) in a state where the second scan signal GC is the turn-on voltage (the high level voltage), and the period (E) is entered. The period (E) is performed for 1H.

In the period (E), the second transistor T2 is turned on and the data voltage $V_{DATA}$ is transferred to the node O through the input capacitor Cpr. At this time, since the third transistor T3 is also turned on by the second scan signal GC, the data voltage $V_{DATA}$ is applied to the node G. When the value of the data voltage transmitted to the node N is transmitted to the node O and the node G, the ratio is partially reduced based on the capacitance magnitude of the input capacitor Cpr. In such an embodiment, when the data voltage value transmitted while the partial ratio (a) is reduced is referred to as $\alpha V_{DATA}$, the existing voltage value of the node G was ($V_{ELVDD}$-Vth), so the final voltage of the node G in the period (E) has a value of ($V_{ELVDD}$-Vth+$\alpha V_{DATA}$). As a result, in the storage capacitor Cst, the threshold voltage of the driving transistor T1 is compensated and also the data voltage is included.

In an embodiment, in the normal pixel, at the falling edge when the first scan signal GW is changed to the low level voltage, the voltage of the node G is lowered by the first boost capacitor Cb1, and the voltage of the node O is lowered by the second boost capacitor Cb2. As a result, in the normal pixel, it may play a role in preventing the voltage value of the node G and the node O from increasing.

After that, while the first scan signal GW is changed to the turn-off voltage (the high level voltage) and the second scan signal GC is also changed to the turn-off voltage (the low level voltage), the period (F) is entered. The second scan signal GC may maintain the turn-off voltage (the low level voltage) from the period (F) to the next period (B), and the first scan signal GW may maintain the turn-off voltage (the high level voltage) until the next period (F). In the period (F), the writing period (the period (E)) is finished. In the normal pixel, at the rising edge when the first scan signal GW is changed to the high level voltage, the voltage of the node G is higher by the first boost capacitor Cb1, and the voltage of the node O is higher by the second boost capacitor Cb2. As a result, when the second scan signal GC is changed from the high level voltage to the low level voltage, the voltage value of the node G and the node O is prevented from being lowered by the parasitic capacitance, thereby playing a role in compensation.

Next, in the period (F), the initialization control signal EB1 is changed to the turn-on voltage (the low level voltage) and then the node N and the node A are again initialized.

After that, the period (G) is entered while the second light-emission control signal EM2 is changed to the turn-on voltage (the low level voltage). In the period (G), since the initialization control signal EB1 has the turn-on voltage (the low level voltage), the node N has the initialization voltage $V_{INT}$, and even if the sixth transistor T6 is turned on, the current is not applied to the light-emitting elements ED1 and ED2 and then light is not emitted.

After that, while the initialization control signal EB1 is changed to the turn-off voltage (the high level voltage), the period (H) is entered, and the period (H) may be a period for preparing the light emission.

After that, the first light-emission control signal EM1 is changed to the turn-on voltage (the low level voltage) and enters the light emission period (the period (I)). In the period (I), the driving transistor T1 receives the driving voltage ELVDD and the light-emission current is generated based on the voltage of the node G and is transmitted to the light-emitting elements ED1 and ED2 to emit light with a predetermined luminance.

Referring to FIG. 6, the rising edges of each signal are set to not be operated simultaneously, and the falling edges of each signal are also set to not be operated simultaneously. As a result, each signal may be set in a way such that the voltage change of each node that may occur as the level of each signal changes does not occur.

Embodiments to be described later with reference to FIGS. 7 to 20 may have a same circuit structure as those described above and may operate in a same way based on applied signal as described above.

Hereinafter, the arrangement structure and cross-section structure of the normal pixel circuit unit PC1 of the first display area DA1 will be described with reference to FIG. 7 to FIG. 13, and the arrangement structure and cross-section structure of the variation pixel circuit unit PC2 of the first second display area DA2-1 will be described with reference to FIG. 14 to FIG. 20.

First, the arrangement structure and cross-section structure of the normal pixel circuit unit PC1 of the first display area DA1 will be described with reference to FIG. 7 and FIG. 8.

Figure 7:
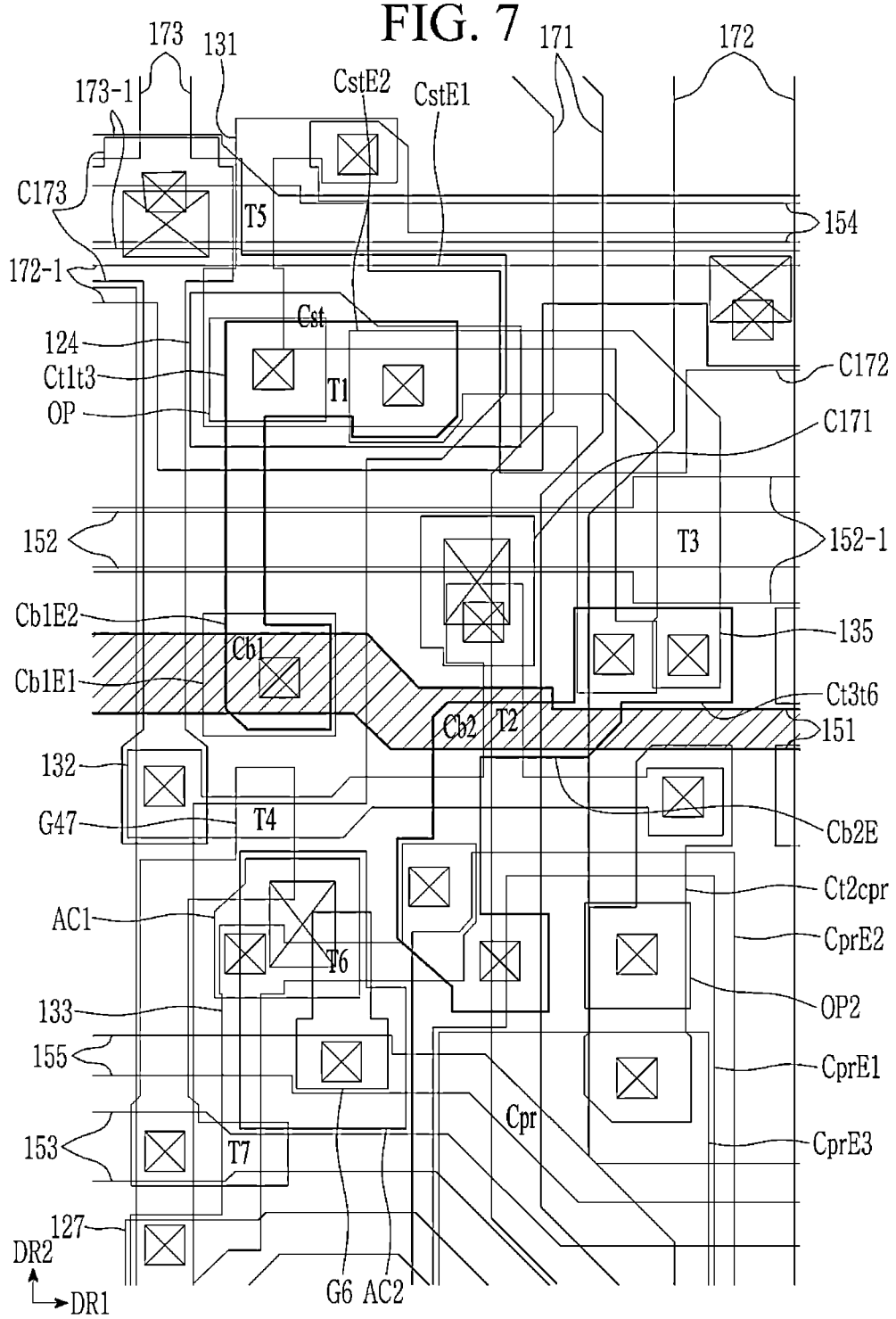
FIG. 7 is a plan view of a pixel of a first display area according to an embodiment.
Figure 8:
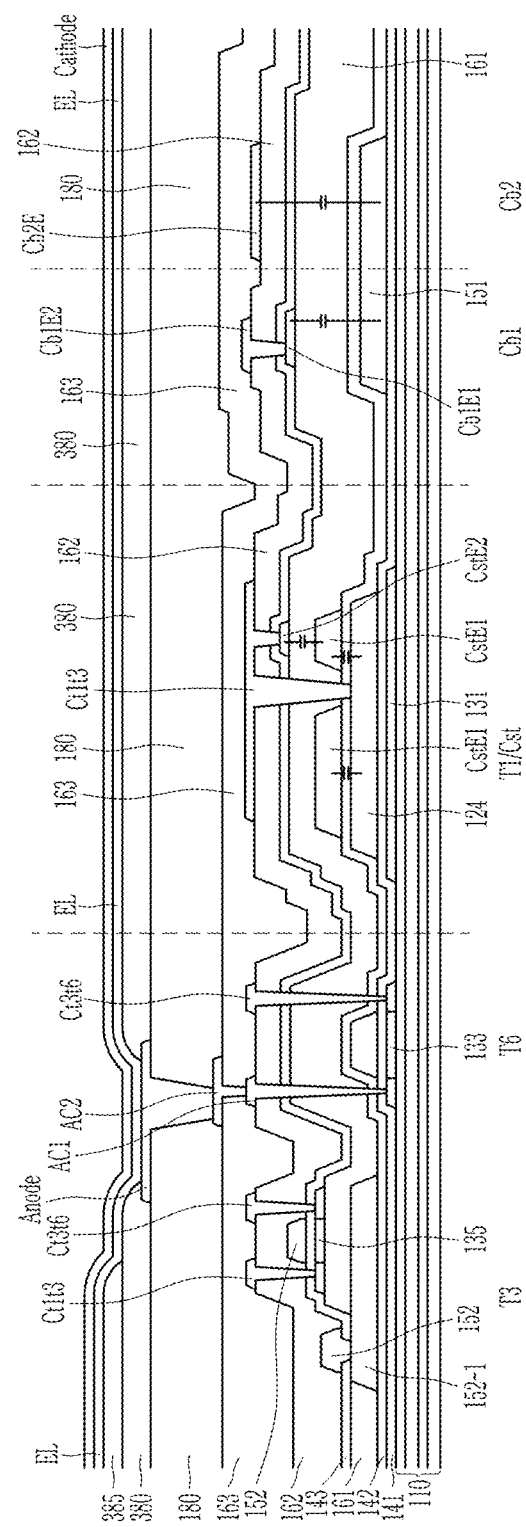
FIG. 8 is a cross-sectional view taken along line VII-VII of FIG. 7.

FIG. 7 is a plan view of a pixel of a first display area according to an embodiment, and FIG. 8 is a cross-sectional view taken along line VII-VII of FIG. 7.

The detail structure of the normal pixel of the first display area DA1 will hereinafter be described.

The normal pixel of the first display area DA1 according to an embodiment mainly includes a first scan line 151, second scan lines 152 and 152-1, an initialization control line 153, and light emission control lines 154 and 155, which extend along the first direction DR1. In an embodiment, a voltage line extending in the first direction DR1 is also included, and an initialization voltage line 127 that transmits the initialization voltage $V_{INT}$ is included.

In an embodiment, the normal pixel of the first display area DA1 includes a data line 171 and a driving voltage line 172 that extend along the second direction DR2 intersecting the first direction and transmit a data voltage $V_{DATA}$ and a driving voltage ELVDD, respectively, and additionally includes a reference voltage line 173 that transmits a reference voltage $V_{REF}$.

In an embodiment, the second driving voltage line 172-1 and the second reference voltage line 173-1 extending in the first direction DR1 are also included to also transmit the driving voltage ELVDD and the reference voltage $V_{REF}$ to the first direction DR1.

Among the transistors connected to such wiring, a transistor is a p-type transistor including polycrystalline semiconductors 131, 132, and 133, and the remaining transistors are an n-type transistor including an oxide semiconductor 135. In an embodiment of FIG. 7, the driving transistor T1, the second transistor T2, the fourth transistor T4, the fifth transistor T5, the sixth transistor T6, and the seventh transistor T7 include the polycrystalline semiconductors 131, 132, and 133, and only the third transistor T3 includes the oxide semiconductor 135.

First, channels, first regions, and second regions of the driving transistor T1 and the fifth transistor T5 are defined in the first semiconductor 131. Here, the first region and the second region are portions that serve as the first and second electrodes of the transistor, and have a similar conductivity characteristic to that of a conductor by being doped or plasma treated. In addition, the channel positioned between the first region and the second region is not doped or plasma treated.

In an embodiment, the channels, the first regions, and the second regions of the second transistor T2 and the fourth transistor T4 are defined in the second semiconductor 132, and the channels, the first regions, and the second regions of the sixth transistor T6 and the seventh transistor T7 are defined in the third semiconductor 133.

A driving gate electrode 124 and a first light emission control line 154 are disposed on the first semiconductor 131 by being insulated therefrom. The channel of the driving transistor T1 is positioned in the region where the first semiconductor 131 and the driving gate electrode 124 overlap each other, and the channel of the fifth transistor T5 is positioned in the region where the first semiconductor 131 and the first light emission control line 154 overlap each other.

The first scan line 151 and the gate electrode G47 are disposed on the second semiconductor 132 by being insulated therefrom. The channel of the second transistor T2 is positioned in the region where the second semiconductor 132 and the first scan line 151 overlap each other, and the channel of the fourth transistor T4 is positioned where the second semiconductor 132 and the gate electrode G47 overlap each other.

The gate electrode G6 and the gate electrode G47 are disposed on the third semiconductor 133 by being insulated therefrom. In the region where the third semiconductor 133 and the gate electrode G6 overlap each other, the channel of the sixth transistor T6 is positioned, and in the position where the third semiconductor 133 and the gate electrode G47 overlap each other, the channel of the seventh transistor T7 is positioned. The gate electrode G47 is extended to overlap the channel of the fourth transistor T4 and the channel of the seventh transistor T7.

In an embodiment, the channel, the first region, and the second region of the third transistor T3 are defined in the oxide semiconductor 135. Here, the first region and the second region are portions that serve as the first and second electrodes of the transistor, and have a similar conductivity characteristic to that of a conductor by being doped or plasma treated. In addition, the channel positioned between the first region and the second region is not doped or plasma treated.

An additional second scan line 152-1 is disposed under the oxide semiconductor 135 by being insulated therefrom, and the second scan line 152 is insulated thereon. A same signal may be applied to two second scan lines 152 and 152-1. According to an embodiment, a constant voltage or a voltage of the corresponding electrode may be applied to the additional second scan line 152-1 by being connected to one electrode. In the region where the oxide semiconductor 135 and the second scan line 152 overlap each other, the channel of the third transistor T3 is positioned. The oxide semiconductor 135 has an additionally extended region CstE2, which has a similar conductivity characteristic to that of a conductor, and may constitute one electrode of the storage capacitor Cst.

The structure of the capacitor of the normal pixel will now described with reference to FIG. 8.

The storage capacitor Cst includes or is defined by the driving gate electrode 124, the extended region CstE1 (hereafter referred to as the first storage electrode) of the second driving voltage line 172-1, and the extended region CstE2 (hereafter referred to as the second storage electrode) of the oxide semiconductor. The storage capacitor Cst may have a triple-layered structure and further includes two insulating layers 142 and 161 therebetween. In addition, in the storage capacitor Cst, the first storage electrode CstE1 receives the driving voltage ELVDD, and two electrodes (the driving gate electrode 124 and the second storage electrode CstE2) on opposing sides are connected to each other by the connection part Ct1t3, thereby having a structure maintaining the voltage of the driving gate electrode 124.

In an embodiment, as shown in FIG. 7, the input capacitor Cpr includes or is defined by the first input electrode CprE1 disposed in a same layer as the driving gate electrode 124, and the second input electrode CprE2 disposed in a same layer as the extended region CstE1 of the second driving voltage line 172-1. In an embodiment, the input capacitor Cpr structure may further include a third input electrode CprE3 disposed in a same layer as the extended region CstE2 of the oxide semiconductor 135, and the third input electrode CprE3 is an additionally provided for a connection of the electrical connection with the second input electrode CprE2 and has a structure that helps an electrical connection with the data line 171. As a result, the input capacitor Cpr is defined by the first input electrode CprE1, the second input electrode CprE2, and the second gate insulating layer 142 positioned therebetween.

The first boost capacitor Cb1 is defined by the first scan line 151 and the first boost electrode Cb1E1 that are insulated from and overlap each other. The first boost electrode Cb1E1 includes a same material as the oxide semiconductor 135 and disposed in a same layer as the oxide semiconductor 135. In an embodiment of FIG. 8, a plurality of insulating layers 142 and 161 are positioned between the first scan line 151 and the first boost electrode Cb1E1, and then the first scan line 151, the first boost electrode Cb1E1, and the insulating layers 142 and 161 therebetween define the first boost capacitor Cb1. in an embodiment, the first boost electrode connection part Cb1E2 is positioned on the first boost electrode Cb1E1, and the first boost electrode connection part Cb1E2 is electrically connected to the first boost electrode Cb1E1 and is integrally formed with the connection part Ct1t3, so that the first boost electrode Cb1E1 is electrically connected to the driving gate electrode 124.

The second boost capacitor Cb2 includes or is defined by the first scan line 151 and the second boost electrode Cb2E that are insulated from and overlap each other. The second boost electrode Cb2E us defined by a part of the connection part Ct3t6. Since the connection part Ct3t6 is a member that connects the third transistor T3 and the sixth transistor T6, one side of the second boost capacitor Cb2 is connected to the third transistor T3 and the sixth transistor T6.

Referring to FIG. 8, the magnitude of the first boost capacitor Cb1, at which the distance between the two electrodes is relatively close, has a larger value than the magnitude of the second boost capacitor Cb2. According to an embodiment, where only one boost capacitor is included, only the first boost capacitor Cb1 may be included and the second boost capacitor Cb2 may be omitted.

The data line 171 is electrically connected to one side of the second semiconductor 132 through the connection part C171 to transmit the data voltage $V_{DATA}$ to the second transistor T2.

The driving voltage line 172 is electrically connected to the second driving voltage line 172-1 through the connection part C172, and the connection part C172 is extended and electrically connected to one side of the first semiconductor 131 to apply the driving voltage ELVDD to the fifth transistor T5.

The reference voltage line 173 is electrically connected to the second reference voltage line 173-1 through the connection part C173, and the connection part C173 is extended and electrically connected to one side of the second semiconductor 132 to apply the reference voltage $V_{REF}$ to the fourth transistor T4.

The initialization control line 153 is electrically connected to the gate electrode G47 to apply the initialization control signal EB1 to the gate electrodes of the fourth transistor T4 and the seventh transistor T7.

The second light emission control line 155 is electrically connected to the gate electrode G6 to apply the second light-emission control signal EM2 to the gate electrode of the sixth transistor T6.

The initialization voltage line 127 is electrically connected to the third semiconductor 133 to apply the initialization voltage $V_{INT}$ to the seventh transistor T7.

The connection part Ct1t3 includes a first boost electrode connection part Cb1E2 and is electrically connected to the driving gate electrode 124 of the driving transistor T1, one side of the oxide semiconductor 135 of the third transistor T3, and the first boost electrode Cb1E1. To connect the connection part Ct1t3 to the driving gate electrode 124 of the driving transistor T1, an opening OP exposing the driving gate electrode 124 is defined or formed in the first storage electrode CstE1.

The connection part Ct3t6 includes the second boost electrode Cb2E, defines one electrode of the second boost capacitor Cb2, and connects the other side of the oxide semiconductor 135 of the third transistor T3 and one side of the third semiconductor 133 of the sixth transistor T6 to each other.

The connection part Ct2cpr connects one side of the second semiconductor 132 of the second transistor T2, the first input electrode CprE1 of the input capacitor Cpr, and the third input electrode CprE3 to each other. In In such an embodiment, an opening OP2 exposing the first input electrode CprE1 is defined or formed in the second input electrode CprE2.

The anode connection parts AC1 and AC2 are connection parts that connect one side of the third semiconductor 133 of the sixth transistor T6 and the anode Anode to each other.

The connection relationship of each constituent element is mainly described above. Hereinafter, the structure of each layer will be described in detail based on FIG. 9 to FIG. 13 along with FIG. 8.

FIG. 9 to FIG. 13 are views based on the manufacturing sequence of the pixel of FIG. 7 and FIG. 8.

Figure 9:
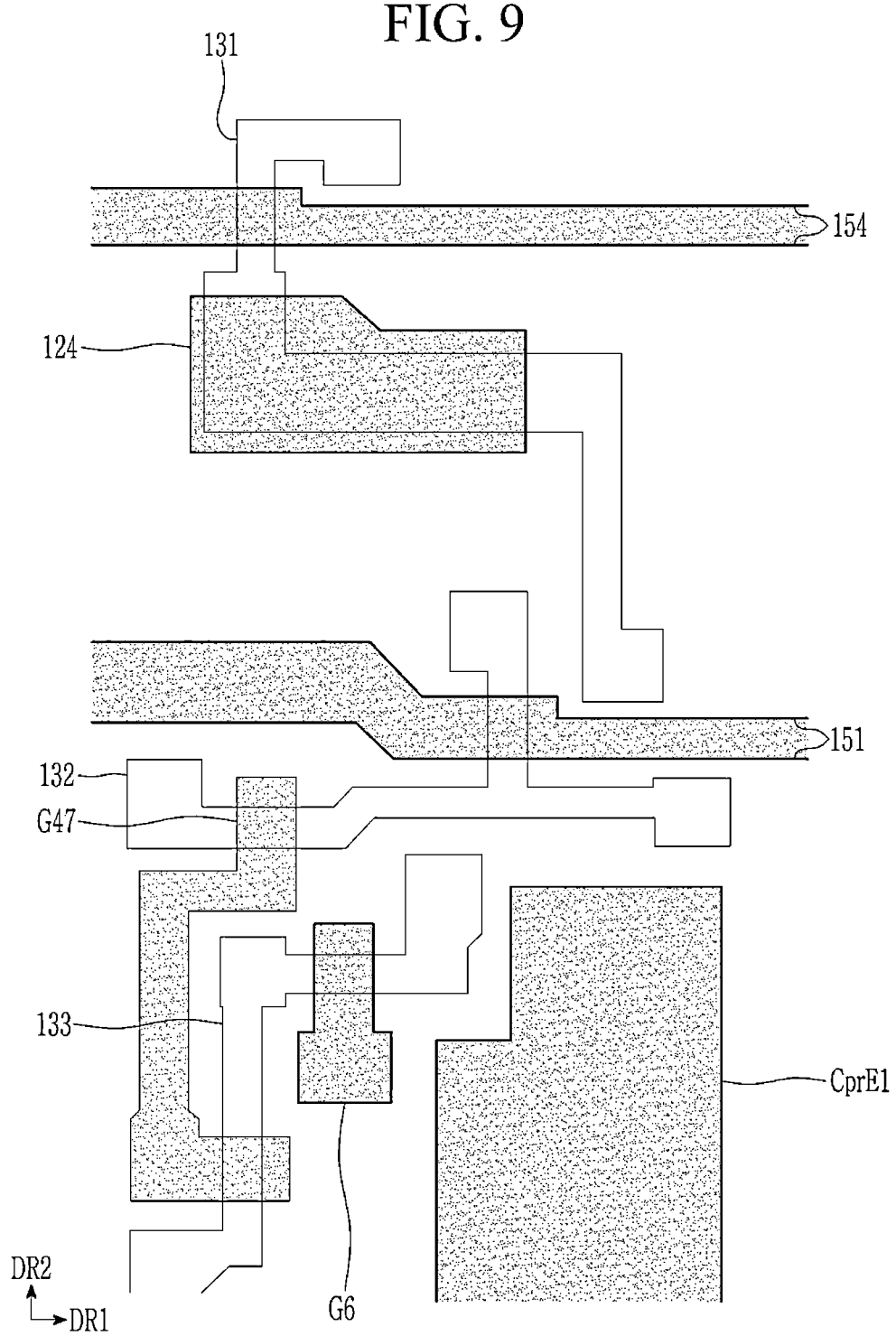
FIG. 9 to FIG. 13 are views based on a manufacturing order of a pixel of FIG. 7 and FIG. 8.

First, FIG. 9 shows a planar structure after the polycrystalline semiconductors 131, 132, and 133 and the first gate conductive layer (124, 151, 154, G47, G6, and CprE1) are fabricated.

The substrate 110, referring to FIG. 8, may include a material that does not bend due to a rigid characteristic such as glass, or a flexible material that may be bent, such as plastic or polyimide.

Referring to FIG. 8 and FIG. 9, the polycrystalline semiconductors 131, 132, and 133 are provided or disposed on the substrate 110. The polycrystalline semiconductors 131, 132, and 133 include the channel region, and the first region and the second region positioned on opposing sides of the channel region.

The first gate insulating layer 141 may cover the polycrystalline semiconductors 131, 132, and 133, and according to an embodiment, the first gate insulating layer 141 may overlap only the channels of the polycrystalline semiconductors 131, 132, and 133. The first gate insulating layer 141 may be an inorganic insulating layer including a silicon oxide (SiOx), a silicon nitride (SiNx), a silicon oxynitride (SiONx), or the like.

The first gate conductive layer (124, 151, 154, G47, G6, and CprE1) is provided or disposed on the first gate insulating layer 141.

The first gate conductive layer includes the driving gate electrode 124, the first scan line 151, the first light emission control line 154, the gate electrode G47, the gate electrode G6, and the first input electrode CprE1 of the input capacitor Cpr. The first gate conductive layer (124, 151, 154, G47, G6, and CprE1) may include a metal or a metal alloy such as copper (Cu), molybdenum (Mo), aluminum (Al), silver (Ag), chromium (Cr), tantalum (Ta), titanium (Ti), or the like, and may be defined by a single layer or multiple layers. The channel of each transistor may be positioned in a region overlapping the first scan line 151, the first light emission control line 154, the gate electrode G47, and the gate electrode G6 on a plane among the polycrystalline semiconductors 131, 132, and 133.

The first gate conductive layer (124, 151, 154, G47, G6, and CprE1) is covered by the second gate insulating layer 142, and the second gate insulating layer 142 may be an inorganic insulating layer including a silicon oxide (SiOx), a silicon nitride (SiNx), or a silicon oxynitride (SiONx).

Figure 10:
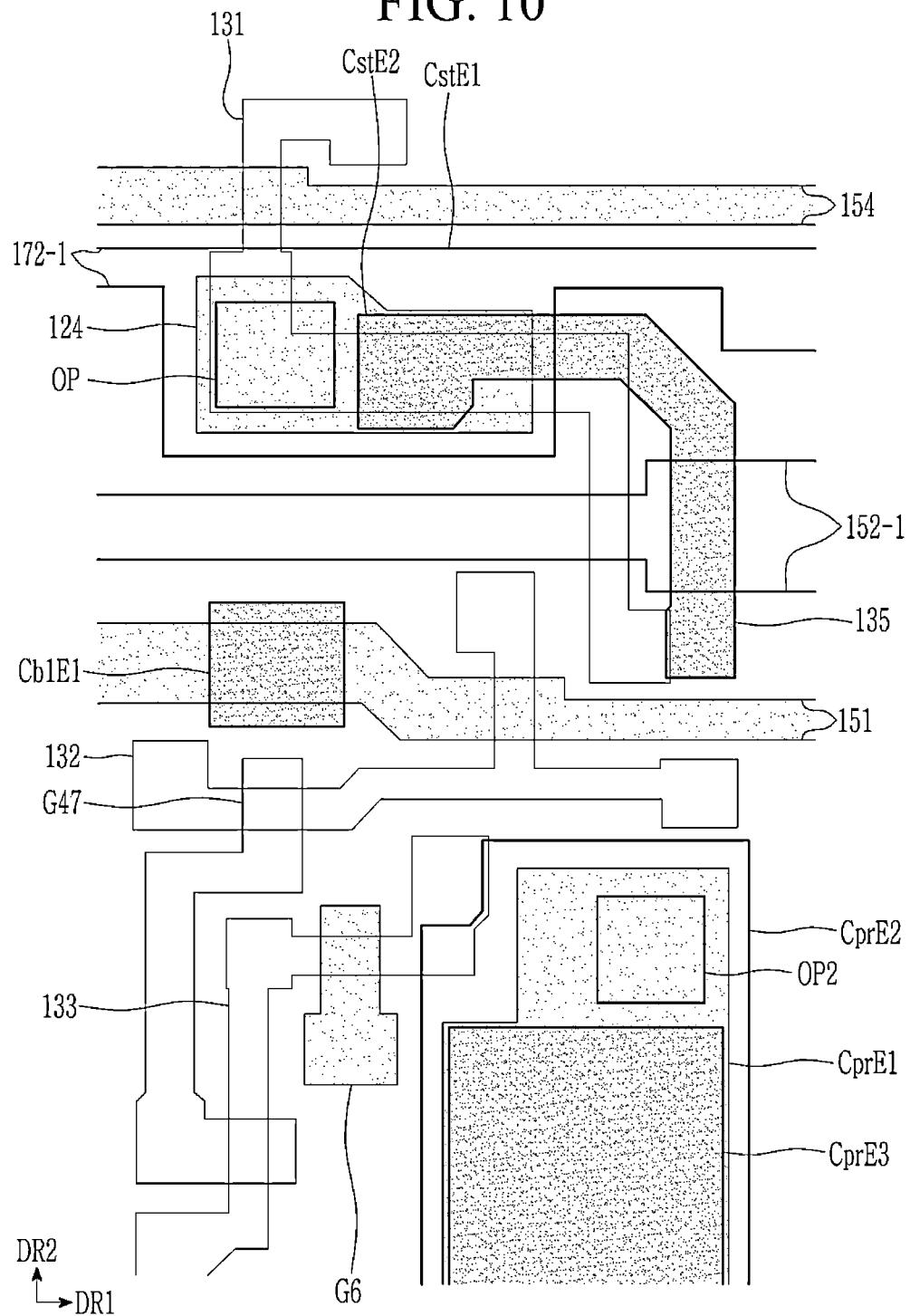

Referring to FIG. 8 and FIG. 10, a second gate conductive layer (172-1, CstE1, 152-1, and CprE2) is disposed on the second gate insulating layer 142. The second gate conductive layer includes the second driving voltage line 172-1, the first storage electrode CstE1 of the storage capacitor Cst, the additional second scan line 152-1 overlapping the second scan line 152 and extending, and the second input electrode CprE2 of the input capacitor Cpr. The second driving voltage line 172-1 may be disposed under the oxide semiconductor 135 to serve as a light blocking layer. In addition, the first storage electrode CstE1 and the second input electrode CprE2 define one electrode of the storage capacitor Cst and the input capacitor Cpr, respectively. The extended region of the second driving voltage line 172-1 is integrally formed and defines the first storage electrode CstE1 of the storage capacitor Cst. The second gate conductive layer (172-1, CstE1, 152-1, and CprE2) may include a metal such as copper (Cu), molybdenum (Mo), aluminum (Al), silver (Ag), chromium (Cr), tantalum (Ta), titanium (Ti), or a metal alloy, and may be defined by a single layer or multiple layers.

The second gate conductive layer (172-1, CstE1, 152-1, and CprE2) is covered by the first interlayer insulating layer 161, and the first interlayer insulating layer 161 may include an inorganic insulating layer including a silicon oxide (SiOx), a silicon nitride (SiNx), or a silicon oxynitride (SiONx).

An oxide semiconductor layer (135, CstE2, Cb1E1, and CprE3) is disposed on the first interlayer insulating layer 161. The oxide semiconductor layer may include the oxide semiconductor 135 including the channel, the first region, and the second region of the third transistor T3, the second storage electrode CstE2 of the storage capacitor Cst, the first boost electrode Cb1E1 of the first boost capacitor Cb1, and the third input electrode CprE3 electrically connected to the second input electrode CprE2 of the input capacitor Cpr. The oxide semiconductor layer (135, CstE2, Cb1E1, and CprE3) may be doped or plasma treated except for the channel of the third transistor T3, so that the doped or plasma treated parts thereof may have an equivalent conductivity characteristic to that of the conductor.

The oxide semiconductor layer (135, CstE2, Cb1E1, and CprE3) is covered by the third gate insulating layer 143, and the third gate insulating layer 143 may include an inorganic insulating layer such as a silicon oxide (SiOx), a silicon nitride (SiNx), a silicon oxynitride (SiONx), etc.

Figure 11:
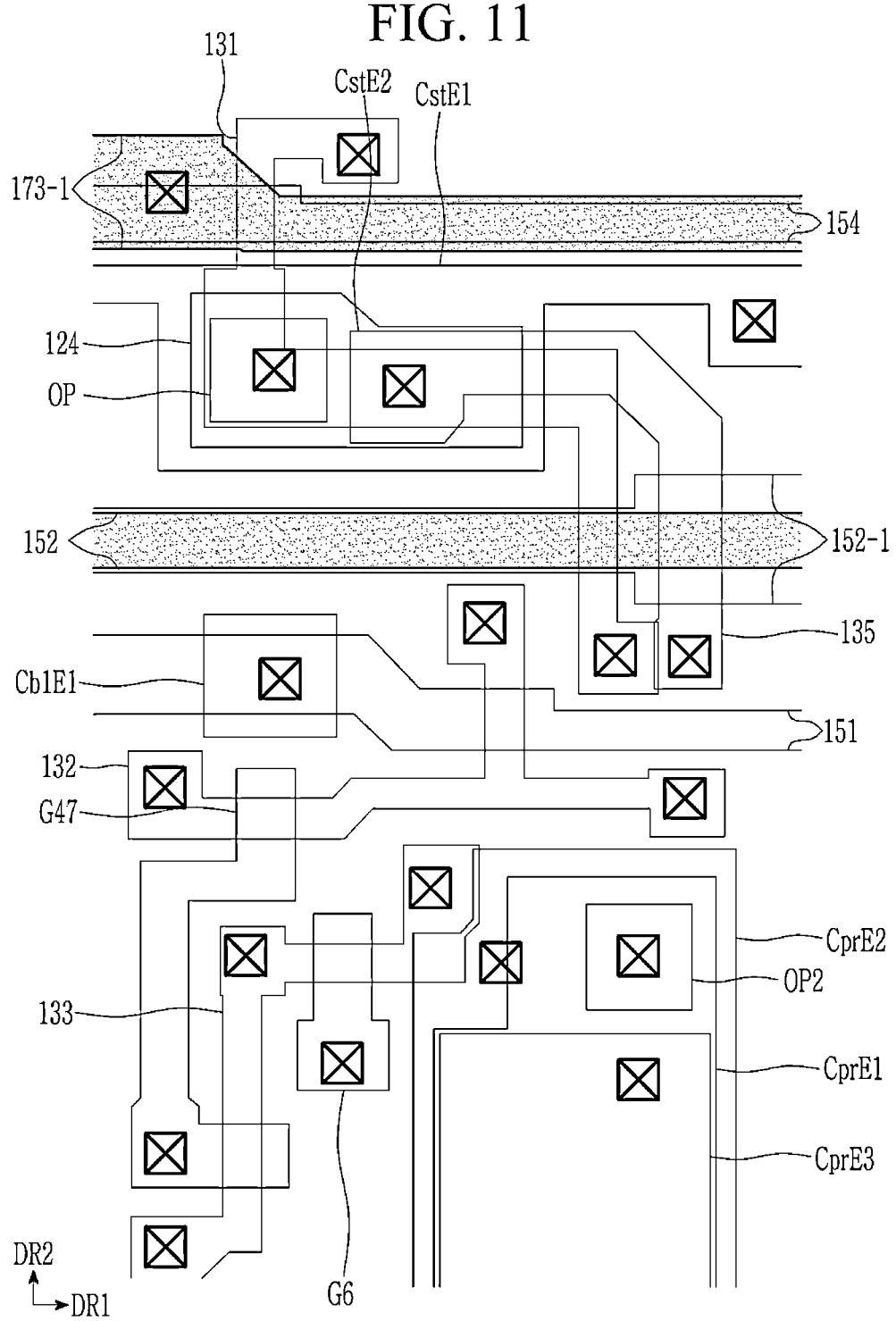

Referring to FIG. 8 and FIG. 11, a third gate conductive layer (152 and 173-1) is disposed on the third gate insulating layer 143. The third gate conductive layer may include a second scan line 152 and a second reference voltage line 173-1. The second scan line 152 may include the gate electrode of the third transistor T3 and may be electrically connected to the additional second scan line 152-1. The third gate conductive layer (152 and 173-1) may include a metal or a metal alloy such as copper (Cu), molybdenum (Mo), aluminum (Al), silver (Ag), chromium (Cr), tantalum (Ta), and titanium (Ti), and may consist of a single layer or multiple layers.

The third gate conductive layer (152 and 173-1) is covered by the second interlayer insulating layer 162, and the second interlayer insulating layer 162 may include an inorganic material including a silicon oxide (SiOx), a silicon nitride (SiNx), a silicon oxynitride (SiONx), etc., and may include an organic material according to an embodiment.

Openings exposing and overlapping the part of the polycrystalline semiconductors 131, 132 and 133, the part of the oxide semiconductor 135, the part of the gate electrode G47, the part of the gate electrode G6, the first boost electrode Cb1E1, the driving gate electrode 124, the first input electrode CprE1, the third input electrode CprE3, the second reference voltage line 173-1, and the second driving voltage line 172-1 are defined in the second interlayer insulating layer 162 and the underlying insulating layer.

Figure 12:
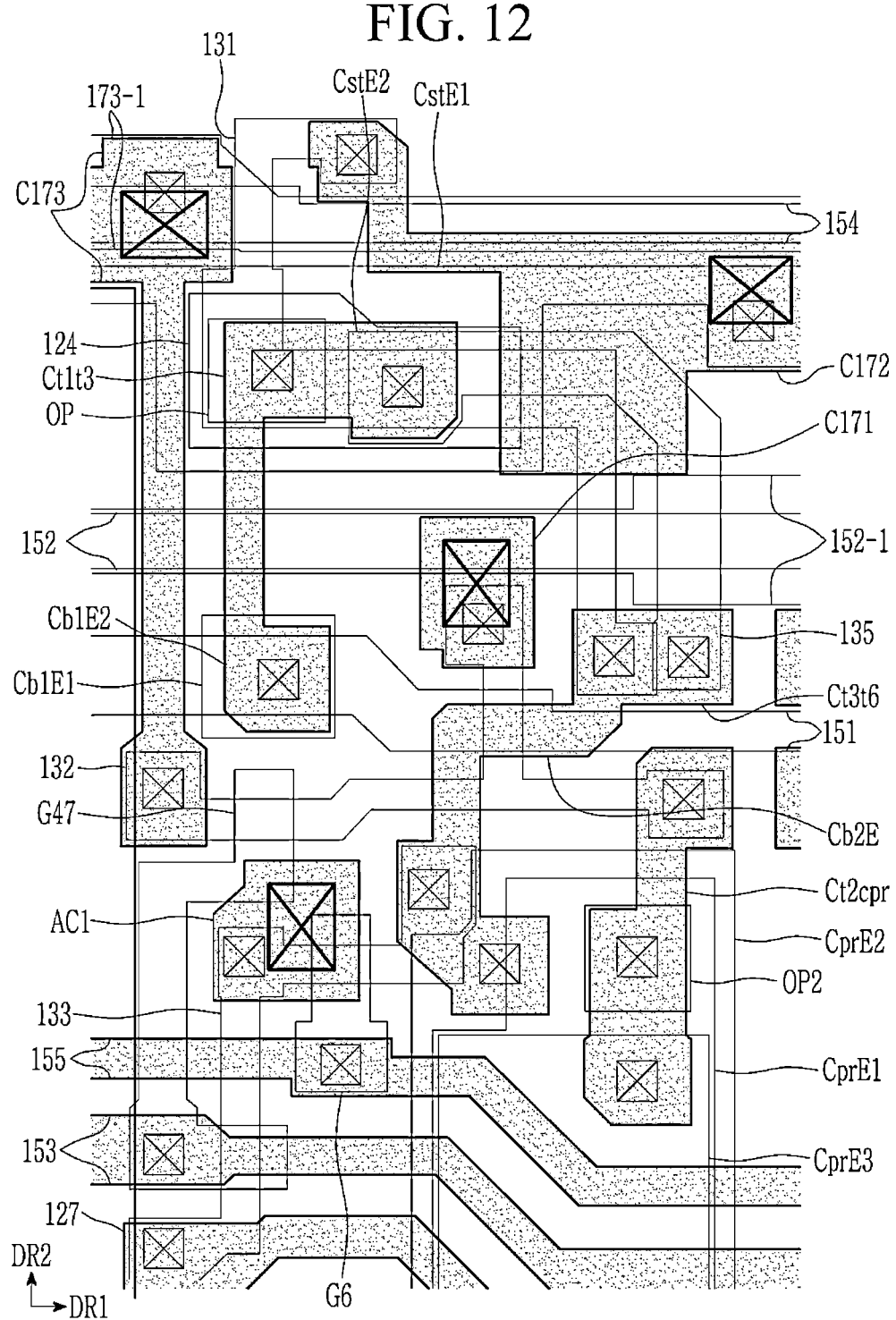

Referring to FIG. 8 and FIG. 12, on the second interlayer insulating layer 162, a first data conductive layer (127, 153, 155, C171, C172, C173, Ct1t3, Ct3t6, Ct2cpr, Cb1E2, Cb2E, and AC1) is disposed. The first data conductive layer may include the initialization voltage line 127, the initialization control line 153, the second light emission control line 155, the connection parts C171, C172, C173, Ct1t3, Ct3t6, and Ct2cpr, the first boost electrode connection part Cb1E2, the second boost electrode Cb2E, and the first anode connection part AC1. Here, the first boost electrode connection part Cb1E2 is the part of the connection part Ct1t3, and the second boost electrode Cb2E is the part of the connection part Ct3t6.

The initialization voltage line 127 is electrically connected to the third semiconductor 133 through an opening to apply the initialization voltage $V_{INT}$ to the seventh transistor T7. The initialization control line 153 is electrically connected to the gate electrode G47 through an opening and applies the initialization control signal EB1 to the gate electrodes of the fourth transistor T4 and the seventh transistor T7. The second light emission control line 155 is electrically connected to the gate electrode G6 through an opening, and applies the second light-emission control signal EM2 to the gate electrode of the sixth transistor T6. The connection part C171 is electrically connected to one side of the second semiconductor 132 through an opening to be connected to the second transistor T2, and is electrically connected to the data line 171 formed layer to transmit the data voltage $V_{DATA}$ to the second transistor T2. The connection part C172 is electrically connected to the second driving voltage line 172-1 and one side of the first semiconductor 131 through an opening to be electrically connected to the driving voltage line 172, and transmits the driving voltage ELVDD to the fifth transistor T5 and the second driving voltage line 172-1. The connection part C173 is electrically connected to the second reference voltage line 173-1 and one side of the second semiconductor 132 through an opening, and is electrically connected to the reference voltage line 173 disposed thereon, so that the reference voltage $V_{REF}$ is transferred to the fourth transistor T4 and the second reference voltage line 173-1. The connection part Ct1t3 includes a first boost electrode connection part CM E2, and is connected to the driving gate electrode 124 of the driving transistor T1, one side of the oxide semiconductor 135 of the third transistor T3, and the first boost electrode Cb1E1 through an opening to be electrically connected to each other. The connection part Ct3t6 includes the second boost electrode Cb2E, and is connected to the other side of the oxide semiconductor 135 of the third transistor T3 and one side of the third semiconductor 133 of the sixth transistor T6 through an opening, thereby being electrically connected thereto. The connection part Ct2cpr is connected to one side of the second semiconductor 132 of the second transistor T2 and the first input electrode CprE1 and the third input electrode CprE3 of the input capacitor Cpr through an opening, thereby being electrically connected thereto. The first anode connection part AC1 is connected to one side of the third semiconductor 133 of the sixth transistor T6 through an opening.

The first data conductive layer (127, 153, 155, C171, C172, C173, Ct1t3, Ct3t6, Ct2cpr, Cb1E2, Cb2E, and AC1) may include a metal or a metal alloy such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), and the like, and may be defined by a single layer or multiple layers.

The first data conductive layer (127, 153, 155, C171, C172, C173, Ct1t3, Ct3t6, Ct2cpr, Cb1E2, Cb2E, and AC1) is covered by the third interlayer insulating layer 163. The third interlayer insulating layer 163 may be an organic insulator including an organic material, and the organic material may include at least one material selected from polyimide, polyamide, acryl resin, benzocyclobutene, and phenol resin. According to an embodiment, the third interlayer insulating layer 163 may be an inorganic insulating layer including a silicon oxide (SiOx), a silicon nitride (SiNx), a silicon oxynitride (SiONx), or the like.

An opening overlapping the first data conductive layer may be defined in the third interlayer insulating layer 163, and the connection parts C171, C172, and C173 and the anode connection part AC1 may be exposed by the opening.

Figure 13:
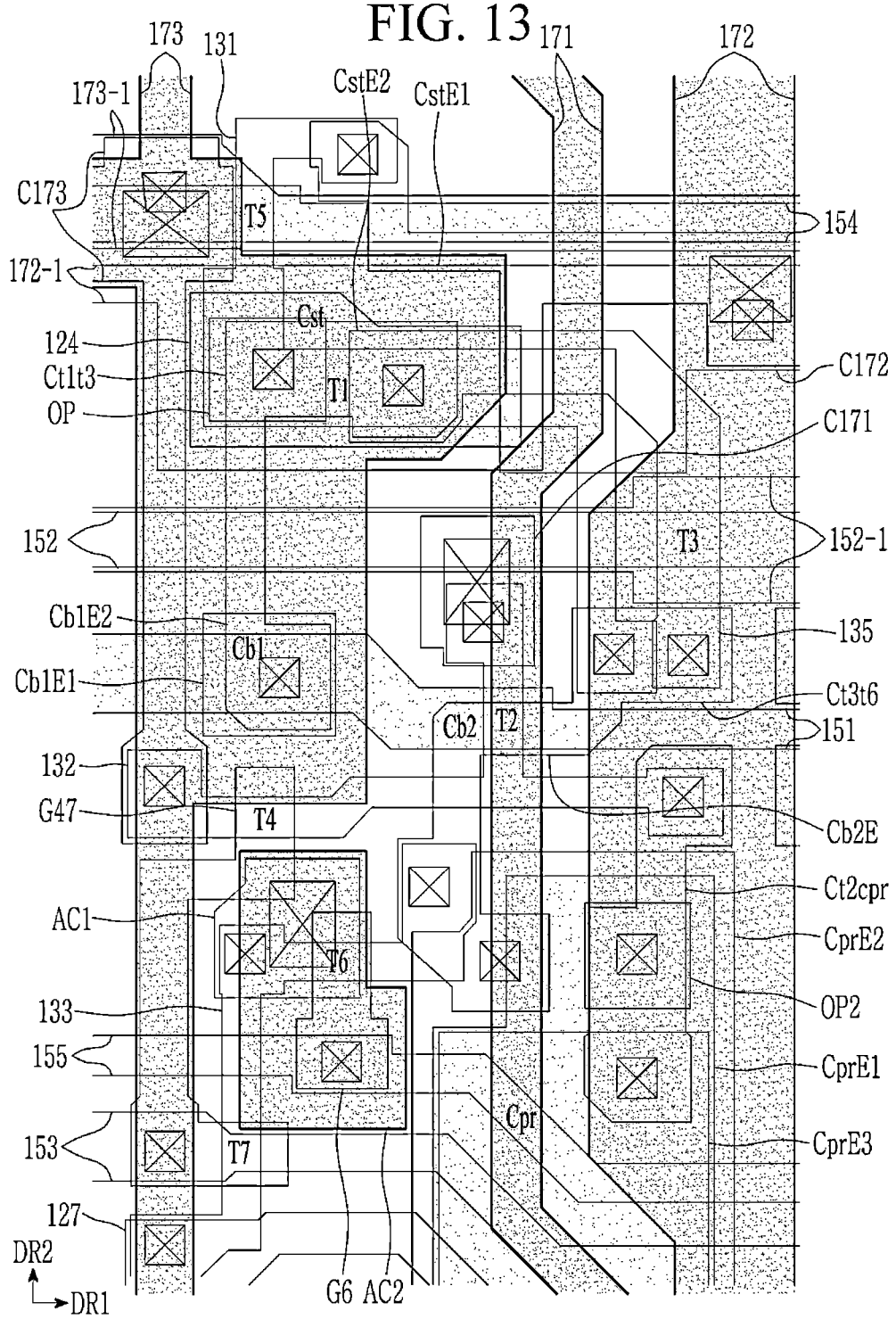

Referring to FIG. 8 and FIG. 13, a second data conductive layer (171, 172, 173, and AC2) is disposed on the third interlayer insulating layer 163. The second data conductive layer includes the data line 171, the driving voltage line 172, the reference voltage line 173, and the second anode connection part AC2.

The data line 171 is connected to the connection part C171 through an opening, and transmits the data voltage $V_{DATA}$ to the second transistor T2 through the connection part C171. The driving voltage line 172 is connected to the connection part C172 through an opening, and transmits the driving voltage ELVDD to the fifth transistor T5 and the second driving voltage line 172-1 through the connection part C172. The reference voltage line 173 is connected to the connection part C173 through an opening, and transmits the reference voltage $V_{REF}$ to the fourth transistor T4 and the second reference voltage line 173-1 through the connection part C173. The second anode connection part AC2 is connected to the first anode connection part AC1 through an opening, and is connected to the sixth transistor T6 through the first anode connection part AC1 to receive the output current, and serves to transmit the output current to the anode Anode.

The second data conductive layer (171, 172, 173, and AC2) may include a metal or a metal alloy such as aluminum (Al), copper (Cu), silver (Ag), gold (Au), platinum (Pt), palladium (Pd), nickel (Ni), molybdenum (Mo), tungsten (W), titanium (Ti), chromium (Cr), and tantalum (Ta), and may be defined by a single layer or multiple layers.

The second data conductive layer (171, 172, 173, and AC2) is covered by the first passivation layer 180. The first passivation layer 180 may be an organic insulator, and may include at least one material selected from polyimide, polyamide, acryl resin, benzocyclobutene, and phenol resin.

An opening exposing the second anode connection part AC2 may be defined in the first passivation layer 180.

Referring to FIG. 8, the anode Anode is disposed on the first passivation layer 180 and is connected to the second anode connection part AC2 through the opening. As a result, the output current is transmitted to the anode Anode. The anode Anode may be defined by a single layer including a transparent conductive oxide film or a metal material, or a multi-layer thereof. The transparent conductive oxide layer may include indium tin oxide ("ITO"), poly-ITO, indium zinc oxide ("IZO"), indium gallium zinc oxide ("IGZO"), indium tin zinc oxide ("ITZO"), etc., and the metal material may include silver (Ag), molybdenum (Mo), copper (Cu), gold (Au), aluminum (Al), etc.

A partition wall 380 covering at least part of the anode Anode while exposing the anode Anode may be disposed on the anode Anode. The partition wall 380 is also referred to as a pixel defining layer ("PDL"), and may be an organic insulator including at least one material selected from polyimide, polyamide, acryl resin, benzocyclobutene, and phenol resin. In an embodiment, the partition wall 380 may be a black PDL having a black color.

A spacer 385 is disposed on the partition wall 380. The spacer 385 may be an organic insulator including at least one material selected from polyimide, polyamide, acryl resin, benzocyclobutene, and phenol resin. In an embodiment, the spacer 385 may include or be formed of a same material as the partition wall 380 together with the partition wall 380. In an embodiment, the spacer 385 may include or be formed of a black organic material having a black color like the partition wall 380.

On the spacer 385 and the partition wall 380, an emission layer EL and a cathode Cathode may be sequentially disposed. The emission layer EL and the cathode Cathode may be disposed over the entire region, and in this embodiment, the emission layer EL may emit light of the same color (e.g., white). In an embodiment, the emission layer EL may be positioned only in the opening defined in the partition wall 380 and positioned only in the upper part of the exposed anode. In such an embodiment, each emission layer EL may emit light of different colors.

The emission layer EL may also include auxiliary layers such as an electron injection layer, an electron transport layer, a hole transport layer, and a hole injection layer, and the hole injection layer and the hole transport layer may be disposed under the emission layer EL, the electron transport layer and the electron injection layer may be disposed on the emission layer EL.

The cathode Cathode may include Indium ITO, IZO, IGZO, ITZO, and the like, as a transparent conductive layer. In an embodiment, the cathode Cathode may have a translucent characteristic, and in this case, the cathode Cathode may constitute a microcavity together with the anode Anode. According to the micro-cavity structure, light of a specific wavelength is emitted upward by the spacing and characteristics between both electrodes, and as a result, may be displayed in red, green, or blue.

Although not shown, at least one layer among an encapsulation layer, a polarization layer, a touch sensing layer, a light blocking member, a color filter, and a color conversion layer including a quantum dot material may be disposed on the cathode Cathode.

In an embodiment, as described above, in the normal pixel shown in FIG. 7 and FIG. 8, the first boost capacitor Cb1 and the second boost capacitor Cb2 are disposed to overlap the first scan line 151.

In such an embodiment, the variation pixel positioned in the second display area DA2 may not include the additional boost capacitors Cb1 and Cb2. In such an embodiment, the first scan line 151 may be disposed to not overlap other portions not to form the first boost capacitor Cb1 and the second boost capacitor Cb2. Hereinafter, the arrangement structure of the second pixel circuit unit PC2 according to an embodiment is shown in FIG. 14 to FIG. 20.

First, the arrangement structure and the cross-section structure of the variation pixel circuit unit PC2 of the second display area DA2 will be described with reference to FIG. 14 and FIG. 15.

Figure 14:
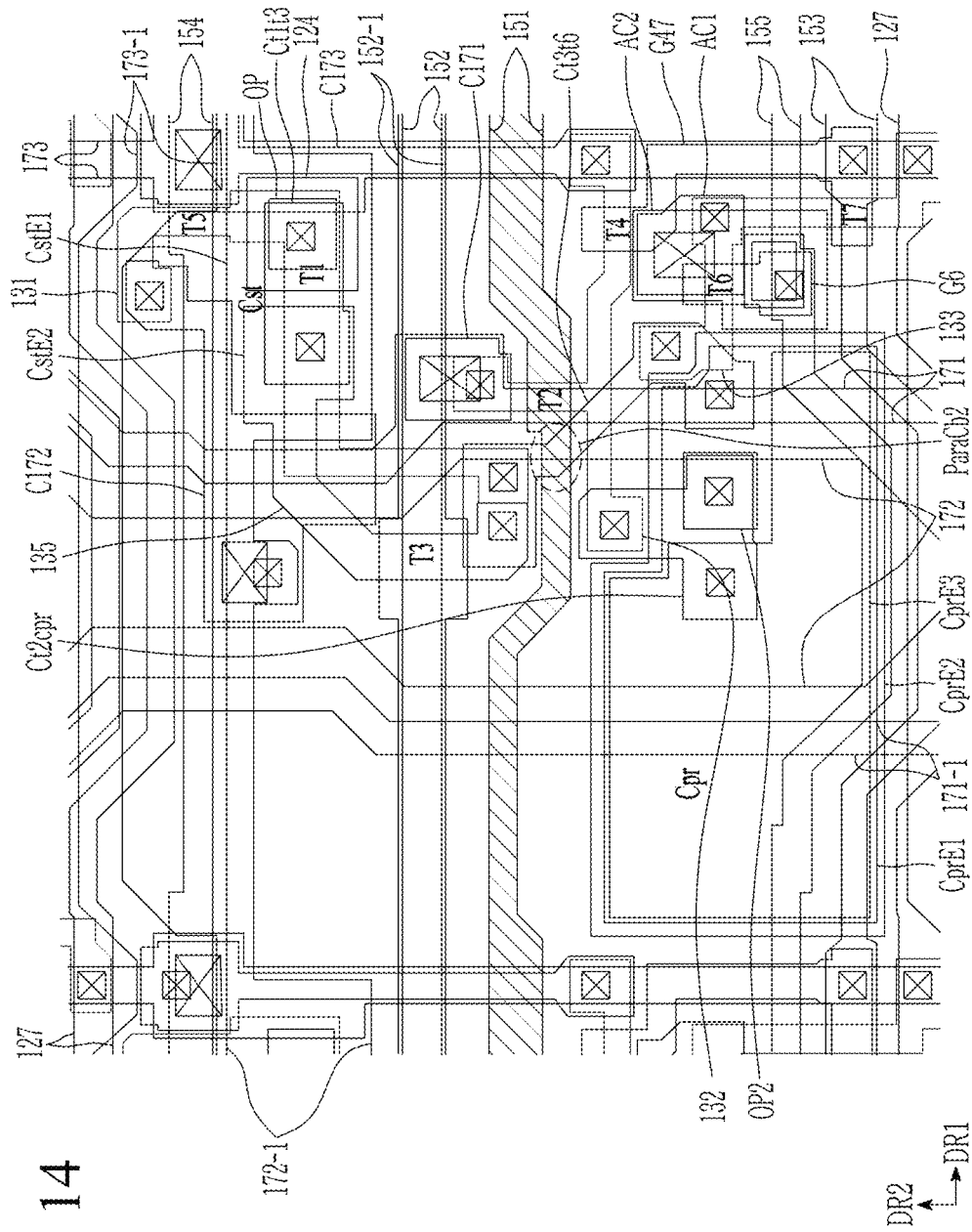
FIG. 14 is a plan view of a pixel of a second display area according to an embodiment.
Figure 15:
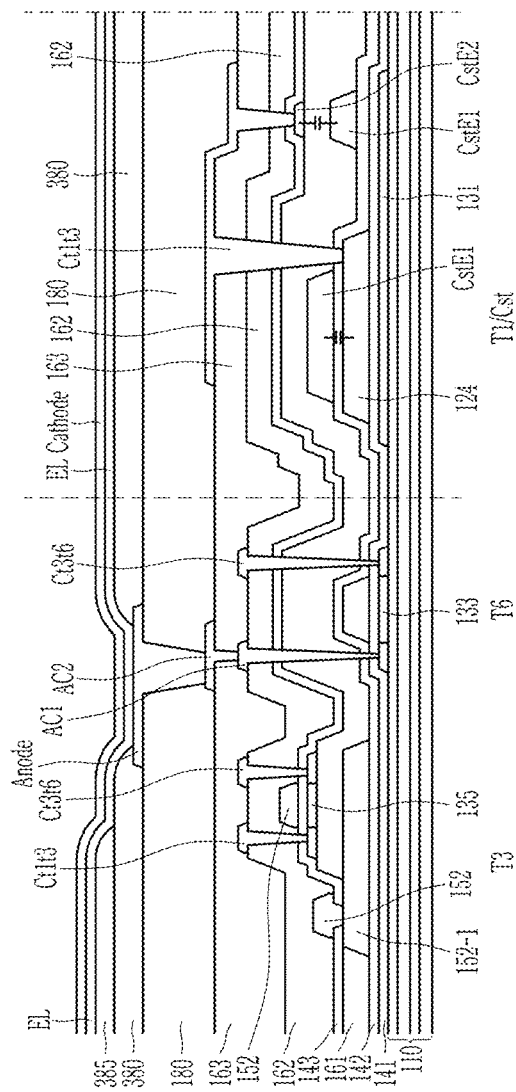
FIG. 15 is a cross-sectional view taken along line XV-XV of FIG. 14.

FIG. 14 is a plan view of a pixel of a second display area according to an embodiment, and FIG. 15 is a cross-sectional view taken along line XV-XV of FIG. 14.

First, features of the structure of the variation pixel of the second display area DA2 different from that of the normal pixel will be described.

In an embodiment, the area occupied by the variation pixel circuit unit PC2 of the second display area DA2 is about twice the area occupied by the normal pixel circuit unit PC1 of the first display area DA1. In such an embodiment, the width in the first direction DR1 of the area occupied by the variation pixel circuit unit PC2 of the second display area DA2 is about twice as large as the width in the first direction DR1 of the area occupied by the normal pixel circuit unit PC1 of the first display area DA1, and the width in the second direction DR2 of the area occupied by the variation pixel circuit unit PC2 of the second display area DA2 may be approximately the same as the width in the second direction DR2 of the area occupied by the normal pixel circuit unit PC1 of the first display.

In the variation pixel circuit unit PC2 of the second display area DA2, the first scan line 151 is extended in the first direction DR1 while being bent away from the driving transistor T1 and the third transistor T3, not to form the boost capacitor. As a result, the capacitance with the gate electrode (the node G) of the driving transistor T1 or the part (corresponding to the node O) where the first semiconductor 131 and the oxide semiconductor 135 are connected is formed as small as possible. That is, even if the capacitance is not formed while overlapping on a plane, a certain amount of a parasitic capacitance exists because the parasitic capacitance may not be removed.

Hereinafter, the detailed structure of the variation pixel of the second display area DA2 will be described.

The variation pixel of the second display area DA2 according to an embodiment includes a first scan line 151, second scan lines 152 and 152-1, an initialization control line 153, and light emission control lines 154 and 155 mainly extending along the first direction DR1. A voltage line extending in the first direction DR1 is also provided and the initialization voltage line 127 that transmits the initialization voltage $V_{INT}$ is included. Here, the first scan line 151 extends in the first direction DR1 while being bent away from the driving transistor T1 and the third transistor T3 in order to not form a boost capacitor in the variation pixel circuit unit PC2 of the second display area DA2.

In an embodiment, the variation pixel of the second display area DA2 includes the data line 171 and the driving voltage line 172 extending in the second direction DR2 crossing the first direction and respectively that transmits the data voltage $V_{DATA}$ and the driving voltage ELVDD, and additionally includes the reference voltage line 173 that transmits the reference voltage $V_{REF}$. In FIG. 14, the line 171-1 may be another data line for another pixel or may be a line for transmitting a voltage or a signal.

In an embodiment, the second driving voltage line 172-1 and the second reference voltage line 173-1 extended in the first direction DR1 are also included to also transmit the driving voltage ELVDD and the reference voltage $V_{REF}$ to the first direction DR1.

Among the transistors connected to such wirings, a transistor is a p-type transistor including the polycrystalline semiconductors 131, 132, and 133, and the remaining transistors are an n-type transistor including the oxide semiconductor 135. In an embodiment of FIG. 14, the driving transistor T1, the second transistor T2, the fourth transistor T4, the fifth transistor T5, the sixth transistor T6, and the seventh transistor T7 are transistors including the polycrystalline semiconductors 131, 132, and 133, and only the third transistor T3 is a transistor including the oxide semiconductor 135.

In an embodiment, the channels, the first regions, and the second regions of the driving transistor T1 and the fifth transistor T5 are defined in the first semiconductor 131. Here, the first region and the second region are portions that serve as the first and second electrodes of the transistor, and have a similar conductivity characteristic to that of a conductor by being doped or plasma treated. In addition, the channel positioned between the first region and the second region is a part that is not doped or plasma treated.

The channels, the first regions, and the second region of the second transistor T2 and the fourth transistor T4 are defined in the second semiconductor 132, and the channels, the first regions, and the second region of the sixth transistor T6 and the seventh transistor T7 are defined in the third semiconductor 133.

A driving gate electrode 124 and a first light emission control line 154 are disposed on the first semiconductor 131 by being insulated therefrom. The channel of driving transistor T1 is positioned in the region where the first semiconductor 131 and the driving gate electrode 124 overlap each other, and the channel of the fifth transistor T5 is positioned in the region where the first semiconductor 131 and the first light emission control line 154 overlap each other.

The first scan line 151 and the gate electrode G47 are disposed on the second semiconductor 132 by being insulated therefrom. In the region where the second semiconductor 132 and the first scan line 151 overlap each other, the channel of the second transistor T2 is positioned, and in the position where the second semiconductor 132 and the gate electrode G47 overlap each other, the channel of the fourth transistor T4 is positioned.

The gate electrode G6 and the gate electrode G47 are disposed on the third semiconductor 133 by being insulated therefrom. In the region where the third semiconductor 133 and the gate electrode G6 overlap each other, the channel of the sixth transistor T6 is positioned, and in the region where the third semiconductor 133 and the gate electrode G47 overlap each other, the channel of the seventh transistor T7 is positioned. The gate electrode G47 is extended to overlap the channel of the fourth transistor T4 and the channel of the seventh transistor T7.

In an embodiment, the channel, the first region, and the second region of the third transistor T3 are defined in the oxide semiconductor 135. Here, the first region and the second region are portions that serve as the first and second electrodes of the transistor, and have a similar conductivity characteristic to that of a conductor by being doped or plasma treated. In addition, the channel positioned between the first region and the second region is a part that is not doped or plasma treated.

An additional second scan line 152-1 is disposed under the oxide semiconductor 135 by being insulated therefrom, and a second scan line 152 is disposed thereon by being insulated therefrom. The same signal may be applied to two second scan lines 152 and 152-1. According to an embodiment, a constant voltage or a voltage of the corresponding electrode may be applied to the additional second scan line 152-1 by being connected to one electrode. In the region where the oxide semiconductor 135 and the second scan line 152 overlap each other, the channel of the third transistor T3 is positioned. The oxide semiconductor 135 has an additionally extended region CstE2, which has a similar conductivity characteristic to that of a conductor, and may constitute one electrode of the storage capacitor Cst.

The structure of the capacitor of the variation pixel will now be described with reference to FIG. 15.

The storage capacitor Cst includes or is defined by the driving gate electrode 124, an extended region CstE1 (hereafter referred to as a first storage electrode) of the second driving voltage line 172-1, and an extended region CstE2 (hereafter referred to as a second storage electrode) of the oxide semiconductor 135. The storage capacitor Cst may have a triple layer structure and further includes two insulating layers 142 and 161 therebetween. In the storage capacitor Cst, the first storage electrode CstE1 receives the driving voltage ELVDD, and the two electrodes (the driving gate electrode 124 and the second storage electrode CstE2) on opposing sides are connected by the connection part Ct1/3, thereby having the structure for maintaining the voltage of the driving gate electrode 124.

Here, the variation pixel positioned in the second display area DA2 may be formed in a way such that the capacity of the storage capacitor Cst is minimized. In such an embodiment, referring to FIG. 14, the area of the driving gate electrode 124 is narrower than the area of the first storage electrode CstE1, and the overlapping region is formed smaller, so that only the minimum storage capacitor Cst is formed.

The input capacitor Cpr is defined by f the first input electrode CprE1 disposed in a same layer as the driving gate electrode 124 and a second input electrode CprE2 disposed in a same layer as the extended region CstE1 of the second driving voltage line 172-1. In an embodiment, the input capacitor Cpr structure may further include a third input electrode CprE3 disposed in a same layer as the extended region CstE2 of the oxide semiconductor 135, and the third input electrode CprE3 is an additionally formed connection part for the electrical connection with the second input electrode CprE2 and has a structure that helps the electrical connection with the data line 171. As a result, the input capacitor Cpr is defined by the first input electrode CprE1, the second input electrode CprE2, and the insulating layer 142 positioned therebetween.

The variation pixel may not further include the first boost capacitor Cb1 and the second boost capacitor Cb2, unlike the normal pixel. However, the parasitic capacitance may occur, and the first scan line 151 may have a structure that is bent in the direction away from the driving transistor T1 and the third transistor T3 to reduce the parasitic capacitance as much as possible.

The data line 171 is electrically connected to one side of the second semiconductor 132 through the connection part C171 to transmit the data voltage $V_{DATA}$ with the second transistor T2.

The driving voltage line 172 is electrically connected to the second driving voltage line 172-1 through the connection part C172, and the connection part C172 is extended and electrically connected to one side of the first semiconductor 131 to apply the driving voltage ELVDD to the fifth transistor T5.

The reference voltage line 173 is electrically connected to the second reference voltage line 173-1 and through the connection part C173, and the connection part C173 is extended and electrically connected to one side of the second semiconductor 132 to apply the reference voltage $V_{REF}$ to the fourth transistor T4.

The initialization control line 153 is electrically connected to the gate electrode G47 to apply the initialization control signal EB1 to the gate electrodes of the fourth transistor T4 and the seventh transistor T7.

The second light emission control line 155 is electrically connected to the gate electrode G6 to apply the second light-emission control signal EM2 to the gate electrode of the sixth transistor T6.

The initialization voltage line 127 is electrically connected to the third semiconductor 133 to apply the initialization voltage $V_{INT}$ to the seventh transistor T7.

The connection part Ct1t3 electrically connects the driving gate electrode 124 of the driving transistor T1 and one side of the oxide semiconductor 135 of the third transistor T3 to each other. In order for the connection part Ct1t3 to be connected to the driving gate electrode 124 of the driving transistor T1, an opening OP exposing the driving gate electrode 124 is defined or formed in the first storage electrode CstE1.

The connection part Ct3t6 connects the other side of the oxide semiconductor 135 of the third transistor T3 and one side of the third semiconductor 133 of the sixth transistor T6 to each other. In an embodiment, referring to a portion encircled by the dotted line in FIG. 14, the connection part Ct3t6 and the first scan line 151 overlap each other. This structure may be a part corresponding to the boost capacitor of the normal pixel and is also referred to as a parasitic boost capacitor ParaCb2 hereinafter. In an embodiment, in the variation pixel, the value of the boost capacitor is minimized while including only the parasitic boost capacitor that is inevitably generated by changing the structure of the first scan line 151.

The connection part Ct2cpr connects one side of the second semiconductor 132 of the second transistor T2 to the first input electrode CprE1 and the third input electrode CprE3 of the input capacitor Cpr. In an embodiment, an opening OP2 exposing the first input electrode CprE1 is defined or formed in the second input electrode CprE2.

The anode connection parts AC1 and AC2 are connection parts that connect one side of the third semiconductor 133 of the sixth transistor T6 and the anode Anode to each other.

As described above, the connection relationship of each constituent element was mainly described. Hereinafter, the structure of each layer will be described in detail with reference to FIG. 16 to FIG. 20 along with FIG. 15.

FIG. 16 to FIG. 20 are views based on a manufacturing sequence of a pixel of FIG. 14 and FIG. 15.

Figure 16:
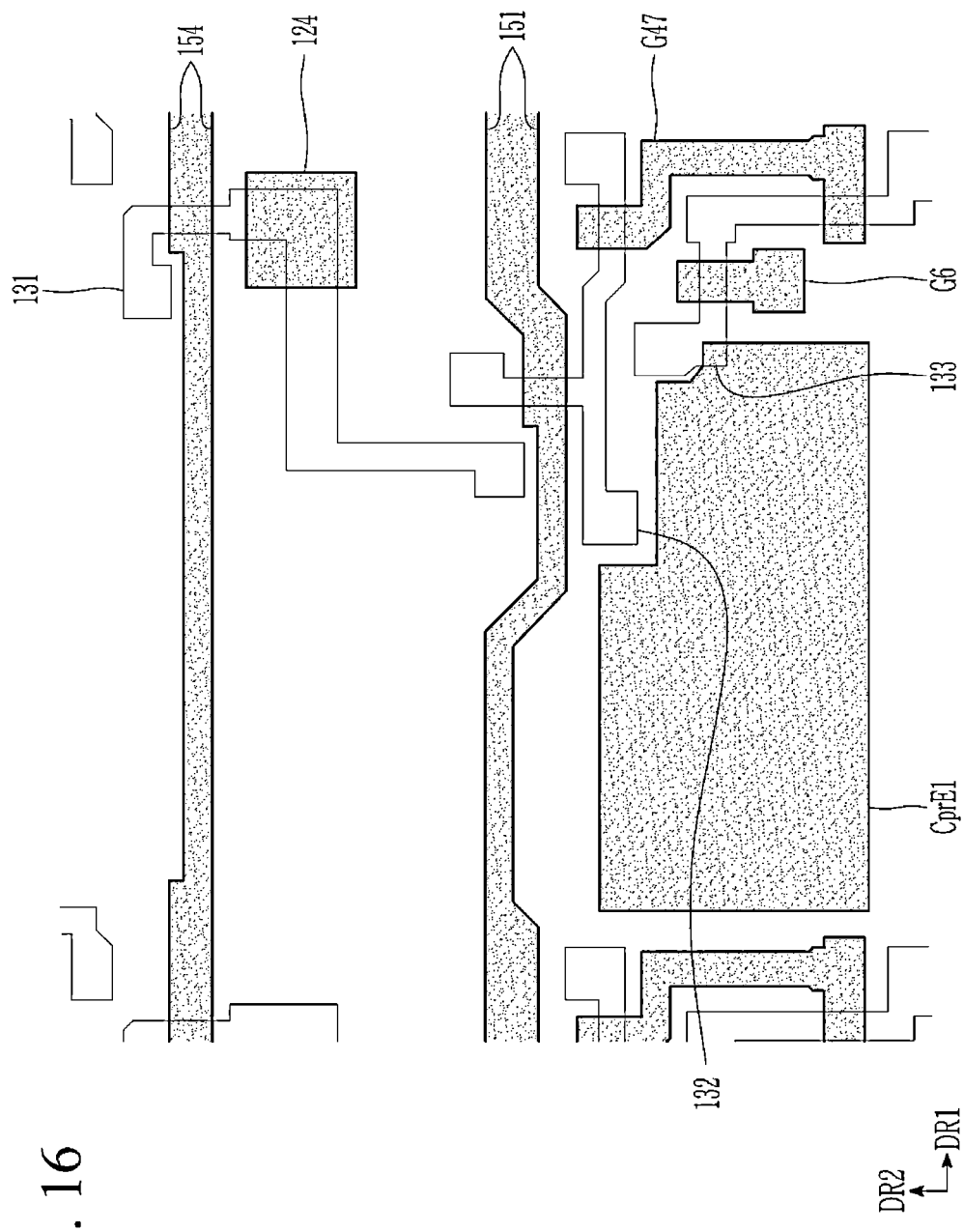
FIG. 16 to FIG. 20 are views based on a manufacturing order of a pixel of FIG. 14 and FIG. 15.

First, FIG. 16 shows the planar structure after the polycrystalline semiconductors 131, 132, and 133 and the first gate conductive layer (124, 151, 154, G47, G6, and CprE1) are formed.

The substrate 110, referring to FIG. 15, may include a material that does not bend due to a rigid characteristic such as glass, or a flexible material that may be bent, such as plastic or polyimide.

Referring to FIG. 15 and FIG. 16, polycrystalline semiconductors 131, 132, and 133 are disposed on the substrate 110. The polycrystalline semiconductors 131, 132, and 133 include a channel region, and a first region and a second region positioned on opposing sides of the channel region.

The first gate insulating layer 141 may cover the polycrystalline semiconductors 131, 132, and 133, and according to an embodiment, the first gate insulating layer 141 may overlap only the channel of the polycrystalline semiconductors 131, 132, and 133. The first gate insulating layer 141 may be an inorganic insulating layer including a silicon oxide (SiOx), a silicon nitride (SiNx), a silicon oxynitride (SiONx), or the like.

A first gate conductive layer (124, 151, 154, G47, G6, and CprE1) is disposed on the first gate insulating layer 141.

The first gate conductive layer includes a driving gate electrode 124, a first scan line 151, a first light emission control line 154, a gate electrode G47, a gate electrode G6, and a first input electrode CprE1 of an input capacitor Cpr. The first gate conductive layer (124, 151, 154, G47, G6, and CprE1) may include a metal or a metal alloy such as copper (Cu), molybdenum (Mo), aluminum (Al), silver (Ag), chromium (Cr), tantalum (Ta), titanium (Ti), or the like, and may be defined by a single layer or multiple layers. The channel of each transistor may be positioned in the region overlapping with the first scan line 151, the first light emission control line 154, the gate electrode G47, and the gate electrode G6 on a plane among the polycrystalline semiconductors 131, 132, and 133.

The first gate conductive layer (124, 151, 154, G47, G6, and CprE1) is covered by the second gate insulating layer 142, and the second gate insulating layer 142 may be an inorganic insulating layer including a silicon oxide (SiOx), a silicon nitride (SiNx), a silicon oxynitride (SiONx), and the like.

Figure 17:
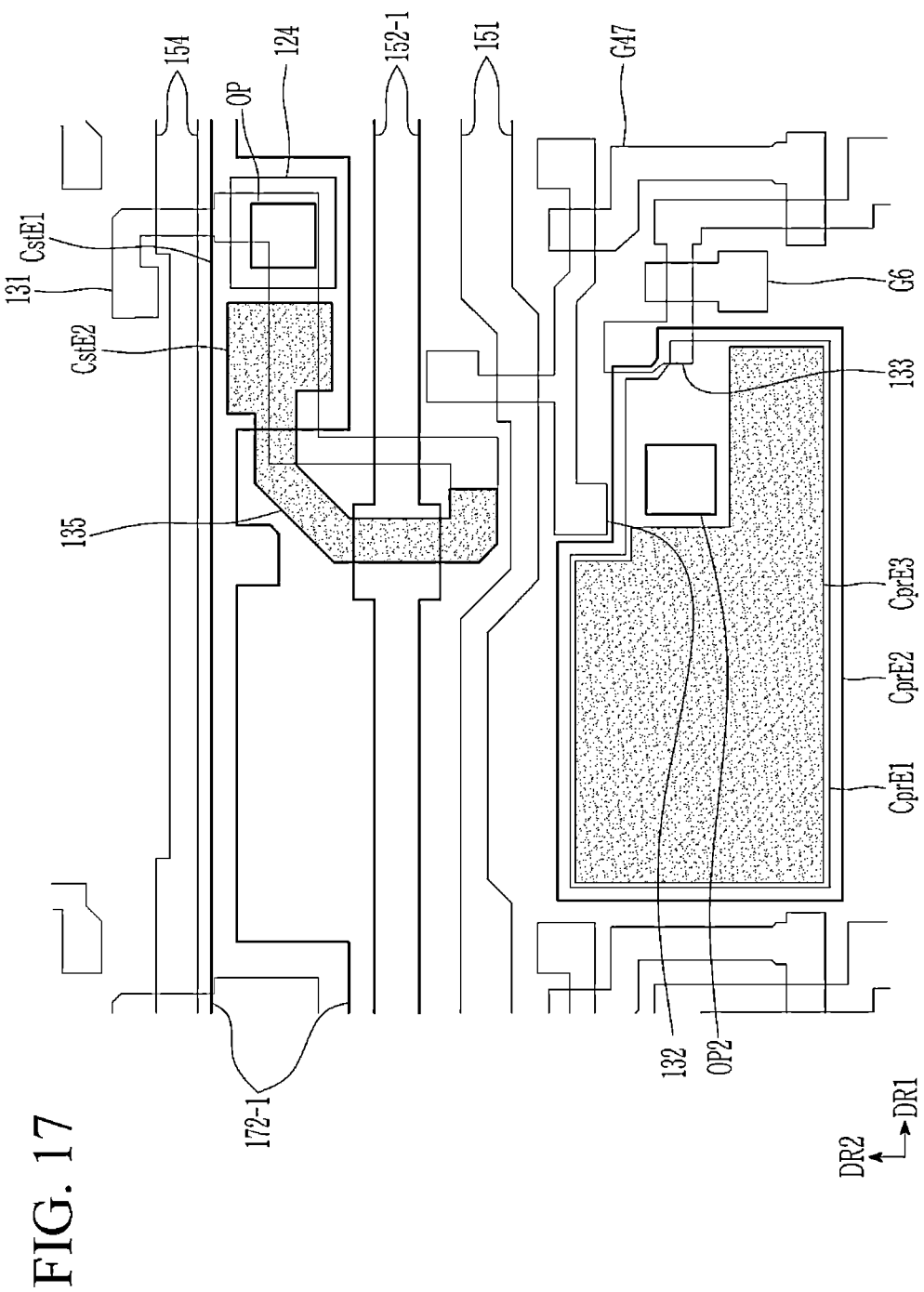

Referring to FIG. 15 and FIG. 17, a second gate conductive layer (172-1, CstE1, 152-1, and CprE2) is disposed on the second gate insulating layer 142. The second gate conductive layer includes a second driving voltage line 172-1, a first storage electrode CstE1 of the storage capacitor Cst, an additional second scan line 152-1 overlapping the second scan line 152 and extending, and a second input electrode CprE2 of an input capacitor Cpr. The second driving voltage line 172-1 may be disposed under the oxide semiconductor 135 to serve as a light blocking layer. In an embodiment, the first storage electrode CstE1 and the second input electrode CprE2 define one electrode of the storage capacitor Cst and the input capacitor Cpr, respectively. The extended region of the second driving voltage line 172-1 is integrally formed, thereby constituting the first storage electrode CstE1 of the storage capacitor Cst. These second gate conductive layer (172-1, CstE1, 152-1, and CprE2) may include a metal or a metal alloy such as copper (Cu), molybdenum (Mo), aluminum (Al), silver (Ag), chromium (Cr), tantalum (Ta), and titanium (Ti), and may be defined by a single layer or multiple layers.

The second gate conductive layer (172-1, CstE1, 152-1, and CprE2) is covered by a first interlayer insulating layer 161, and the first interlayer insulating layer 161 may include an inorganic insulating layer including a silicon oxide (SiOx), a silicon nitride (SiNx), or a silicon oxynitride (SiONx).

An oxide semiconductor layer (135, CstE2, and CprE3) is disposed on the first interlayer insulating layer 161. The oxide semiconductor layer may include an oxide semiconductor 135 including the channel, the first region, and the second region of the third transistor T3, a second storage electrode CstE2 of the storage capacitor Cst, and a third input electrode CprE3 electrically connected to the second input electrode CprE2 of the input capacitor Cpr. The oxide semiconductor layer (135, CstE2, and CprE3) is doped or plasma treated except for the channel of the third transistor T3, so that the doped or plasma treated portions may have a similar conductivity characteristic to that of the conductor.

The oxide semiconductor layer (135, CstE2 and CprE3) is covered by a third gate insulating layer 143, and the third gate insulating layer 143 may include an inorganic insulating layer including a silicon oxide (SiOx), a silicon nitride (SiNx), a silicon oxynitride (SiONx), and the like.

Figure 18:
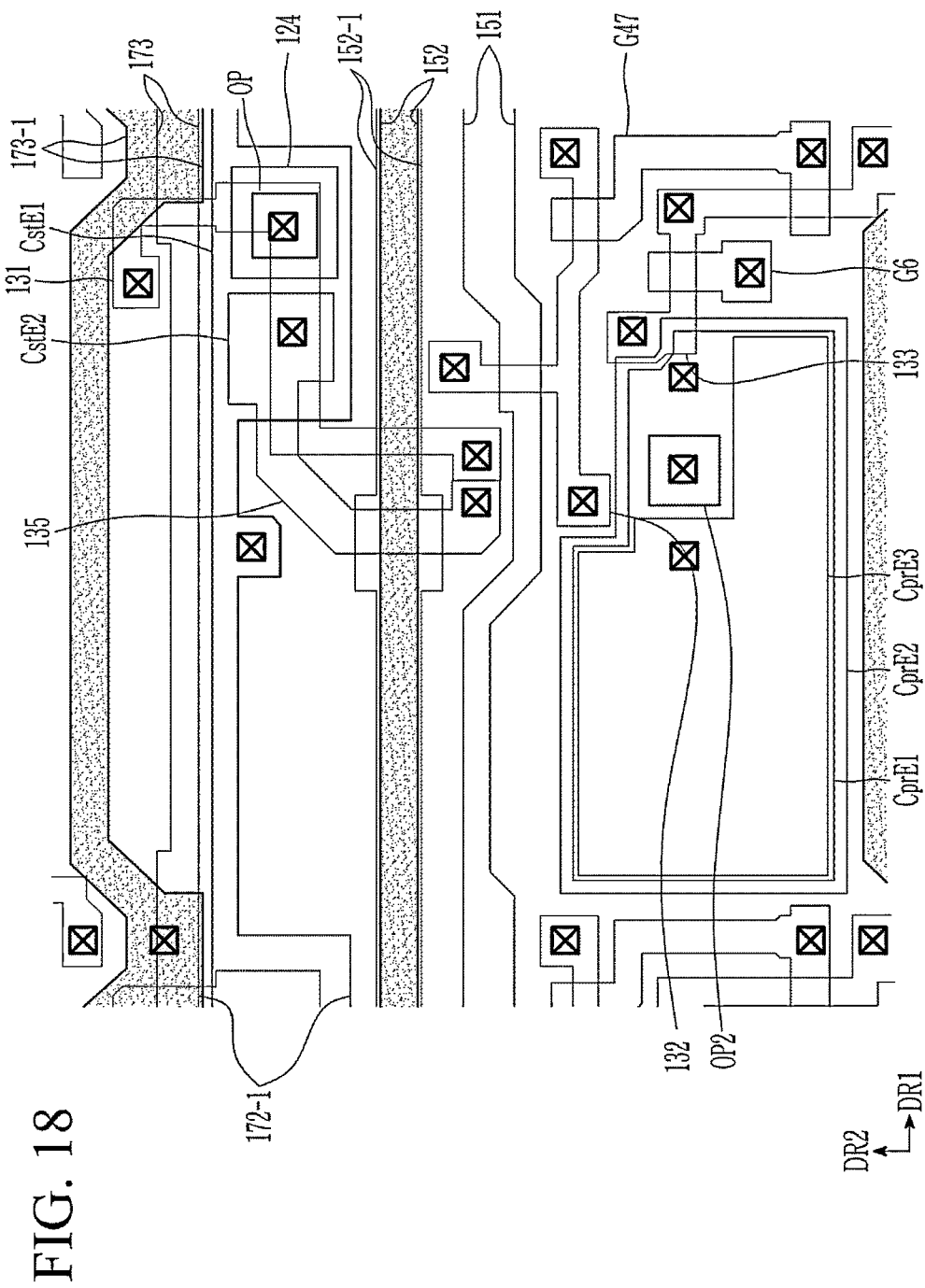

Referring to FIG. 15 and FIG. 18, a third gate conductive layer (152 and 173-1) is disposed on the third gate insulating layer 143. The third gate conductive layer may include a second scan line 152 and a second reference voltage line 173-1. The second scan line 152 may include a gate electrode of the third transistor T3 and may be electrically connected to the additional second scan line 152-1. The third gate conductive layer 152 and 173-1 may include a metal or a metal alloy such as copper (Cu), molybdenum (Mo), aluminum (Al), silver (Ag), chromium (Cr), tantalum (Ta), or titanium (Ti), and may consist of a single layer or multiple layers.

The third gate conductive layer (152 and 173-1) is covered by a second interlayer insulating layer 162, and the second interlayer insulating layer 162 may include an insulating layer containing a silicon oxide (SiOx), a silicon nitride (SiNx), a silicon oxynitride (SiONx), etc., and may include an organic material according to an embodiment.

An opening exposing and overlapping the part of the polycrystalline semiconductors 131, 132, and 133, the part of the oxide semiconductor 135, the part of the gate electrode G47, the part of the gate electrode G6, the driving gate electrode 124, the first input electrode CprE1, the third input electrode CprE3, the second reference voltage line 173-1, and the second driving voltage line 172-1 may be defined in the second interlayer insulating layer 162 and the insulating layer disposed thereunder.

Figure 19:
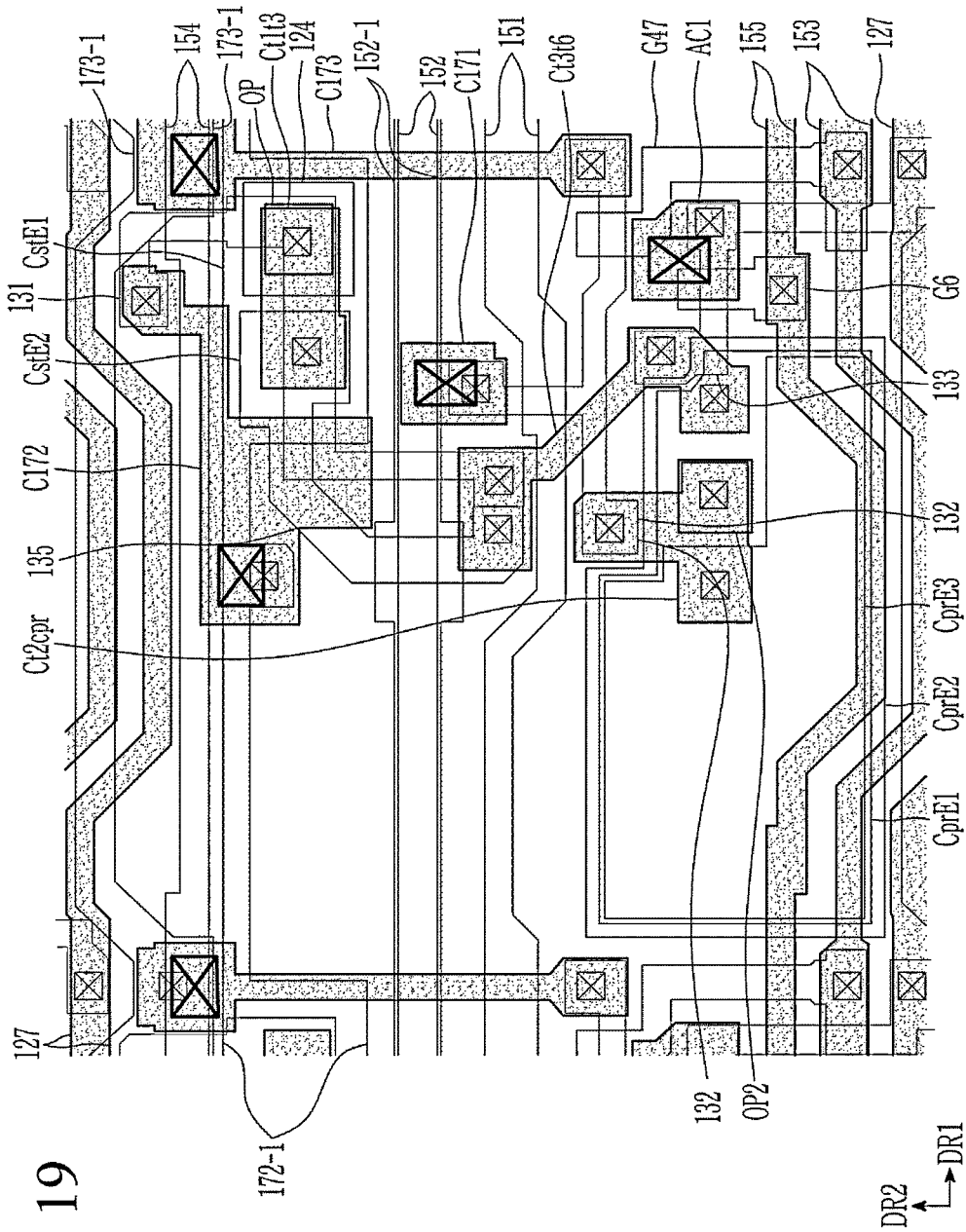

Referring to FIG. 15 and FIG. 19, a first data conductive layer (127, 153, 155, C171, C172, C173, Ct1t3, Ct3t6, Ct2cpr, and AC1) is disposed on the second interlayer insulating layer 162. The first data conductive layer may include an initialization voltage line 127, an initialization control line 153, a second light emission control line 155, connection parts C171, C172, C173, Ct1t3, Ct3t6, and Ct2cpr, and a first anode connection part AC1.

The initialization voltage line 127 is electrically connected to the third semiconductor 133 through the opening to apply the initialization voltage $V_{INT}$ to the seventh transistor T7. The initialization control line 153 is electrically connected to the gate electrode G47 through the opening to apply the initialization control signal EB1 to the gate electrodes of the fourth transistor T4 and the seventh transistor T7. The second light emission control line 155 is electrically connected to the gate electrode G6 through an opening to apply the second light-emission control signal EM2 to the gate electrode of the sixth transistor T6. The connection part C171 is electrically connected to one side of the second semiconductor 132 through an opening to be connected to the second transistor T2, and is electrically connected to the data line 171 disposed thereon to transmit the data voltage $V_{DATA}$ to the second transistor T2. The connection part C172 is electrically connected to the second driving voltage line 172-1 and one side of the first semiconductor 131 through an opening, and is electrically connected to the driving voltage line 172 disposed thereon, so that the driving voltage ELVDD is transferred to the fifth transistor T5 and the second driving voltage line 172-1. The connection part C173 is electrically connected to the second reference voltage line 173-1 and one side of the second semiconductor 132 through an opening, and is electrically connected to the reference voltage line 173 disposed thereon, so that the reference voltage $V_{REF}$ is transferred to the fourth transistor T4 and the second reference voltage line 173-1. The connection part Ct1t3 is connected to the driving gate electrode 124 of the driving transistor T1 and one side of the oxide semiconductor 135 of the third transistor T3 through an opening, thereby electrically connecting them to each other. The connection part Ct3t6 is connected to the other side of the oxide semiconductor 135 of the third transistor T3 and one side of the third semiconductor 133 of the sixth transistor T6 through the opening, thereby electrically connecting them to each other. The connection part Ct2cpr is connected to one side of the second semiconductor 132 of the second transistor T2 and the first input electrode CprE1 of the input capacitor Cpr and the third input electrode CprE3 through the opening, thereby electrically connecting them to each other. The first anode connection part AC1 is connected to one side of the third semiconductor 133 of the sixth transistor T6 through the opening.

The first data conductive layer (127, 153, 155, C171, C172, C173, Ct1t3, Ct3t6, Ct2cpr, and AC1) may include a metal or metal alloy such as aluminum (Al), copper (Cu), silver (Ag), gold (Au), platinum (Pt), palladium (Pd), nickel (Ni), molybdenum (Mo), tungsten (W), titanium (Ti), chromium (Cr), or tantalum (Ta), and may consist of a single layer or multiple layers.

The first data conductive layer (127, 153, 155, C171, C172, C173, Ct1t3, Ct3t6, Ct2cpr, and AC1) is covered by a third interlayer insulating layer 163. The third interlayer insulating layer 163 may be an organic insulator including an organic material, and the organic material may include at least one material selected from the group consisting of polyimide, polyamide, acryl resin, benzocyclobutene, and phenol resin. According to an embodiment, the third interlayer insulating layer 163 may be an inorganic insulating layer including a silicon oxide (SiOx), a silicon nitride (SiNx), a silicon oxynitride (SiONx), or the like.

The third interlayer insulating layer 163 may include an opening overlapping the first data conductive layer, and the connection parts C171, C172, and C173 and the anode connection part AC1 may be exposed by the opening.

Figure 20:
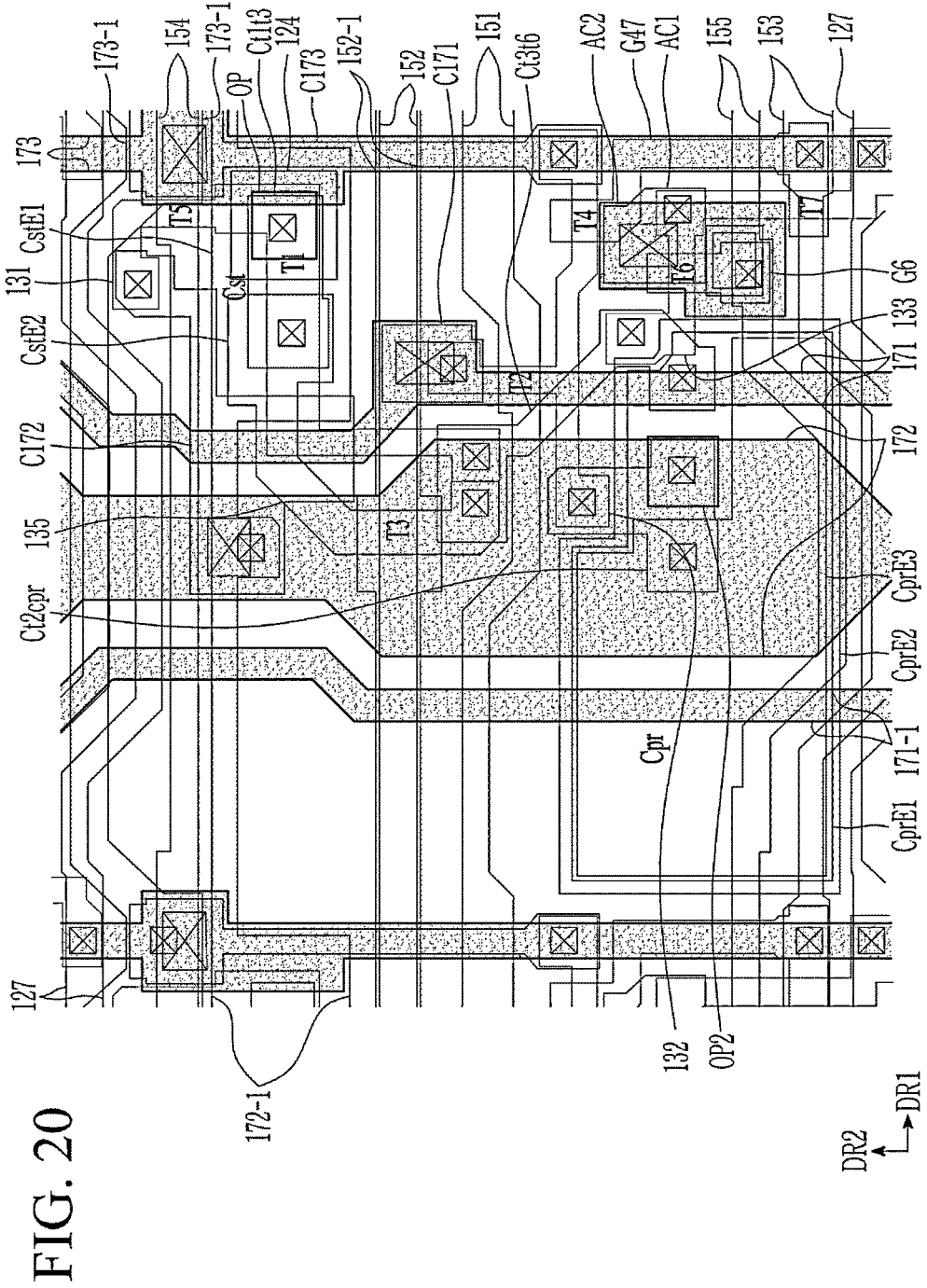

Referring to FIG. 15 and FIG. 20, a second data conductive layer (171, 172, 173, and AC2) is positioned on the third interlayer insulating layer 163. The second data conductive layer includes a data line 171, a driving voltage line 172, a reference voltage line 173, and a second anode connection part AC2.

The data line 171 is connected to the connection part C171 through the opening to transmit the data voltage $V_{DATA}$ to the second transistor T2 through the connection part C171. The driving voltage line 172 is connected to the connection part C172 through the opening to transmit the driving voltage ELVDD to the fifth transistor T5 and the second driving voltage line 172-1 through the connection part C172. The reference voltage line 173 is connected to the connection part C173 through an opening, and transmits the reference voltage $V_{REF}$ to the fourth transistor T4 and the second reference voltage line 173-1 through the connection part C173. The second anode connection part AC2 is connected to the first anode connection part AC1 through an opening, and is connected to the sixth transistor T6 through the first anode connection part AC1 to receive the output current, and serves to transmit it to the anode. In FIG. 20, the line 171-1 may be another data line for another pixel or may be a line for transmitting a voltage or a signal.

The second data conductive layer (171, 172, 173, and AC2) may include a metal or a metal alloy such as aluminum (Al), copper (Cu), silver (Ag), gold (Au), platinum (Pt), palladium (Pd), nickel (Ni), molybdenum (Mo), tungsten (W), titanium (Ti), chromium (Cr), and tantalum (Ta), and may be defined by a single layer or multiple layers.

The second data conductive layer (171, 172, 173, and AC2) is covered by a first passivation layer 180. The first passivation layer 180 may be an organic insulator, and may include at least one material selected from polyimide, polyamide, acryl resin, benzocyclobutene, and phenol resin.

An opening exposing the second anode connection part AC2 may be defined in the first passivation layer 180.

Referring to FIG. 15, the anode Anode is disposed on the first passivation layer 180 and is connected to the second anode connection part AC2 through an opening. As a result, the output current is transmitted to the anode. The anode Anode may be defined by a single layer including a transparent conductive oxide layer or a metal material or a multi-layer including these. The transparent conductive oxide layer may include ITO, (poly)-ITO, IZO, IGZO and ITZO, or the like, and the metal material may include silver (Ag), molybdenum (Mo), copper (Cu), gold (Au), aluminum (Al), and the like.

In the second display area DA2, in the case of the second second display area DA2-2, the anode of the light-emitting element may also be disposed on the driving unit DR, so that the second anode connection part AC2 may extend to the upper part of the driving unit DR.

The structure formed above the anode Anode is the same as that shown in FIG. 8, so any repetitive detailed description thereof will be omitted.

Referring to FIG. 8, in the normal pixel, for the magnitude of the first boost capacitor Cb1 and the second boost capacitor Cb2, the first boost capacitor Cb1 having a close distance between two electrodes, and has the larger value. As a result, according to an embodiment, where the normal pixel includes only one boost capacitor, the normal pixel may include only the first boost capacitor Cb1. In an embodiment, referring to FIG. 14, the second boost capacitor Cb2 may be included in the variation pixel positioned in the second display area DA2 as a parasitic capacitor.

In an embodiment, in the normal pixel, where the capacitance of the storage capacitor Cst is set as about 67 farad (f), and the capacitance of the input capacitor Cpr is set as about 193 f, the sum of the values of two boost capacitors Cb1 and Cb2 may be set as about 8.6 f. That is, the sum of the values of two boost capacitors Cb1 and Cb2 may be about 1/10 or more and about 1/5 or less of the capacitance value of the storage capacitor Cst, and may be about 1/30 or more and about 1/10 or less of the capacitance value of the input capacitor Cpr. In such an embodiment, in the variation pixel positioned in the second display area DA2, the capacitance of the storage capacitor Cst may be set as about 50 f, and the capacitance of the input capacitor Cpr for each color may be about 460 f in a red pixel, about 540 f in a green pixel, and about 459 f in a blue pixel. Also, in the variation pixel, the parasitic capacitance value corresponding to the boost capacitors Cb1 and Cb2 may have a value of about 2.3 f. In the variation pixel, the capacitance value of the storage capacitor Cst may be smaller than the capacitance value of the storage capacitor Cst of the normal pixel. In an embodiment, the capacitance value of the input capacitor Cpr in the variation pixel may be set to be smaller than the capacitance value of the storage capacitor Cst in the normal pixel, and the different capacitance of the input capacitor Cpr may be set for each color. That is, a ratio (a Cpr/Cst ratio) of the capacitance value of the input capacitor Cpr for the capacitance value of the storage capacitor Cst may be designed to be differentiated depending on the color in the variation pixel positioned in the second display area DA2.

In an embodiment, in the variation pixel positioned in the second display area DA2, the capacitance of the storage capacitor Cst may be formed to be minimized, the area of the driving gate electrode 124 is narrower compared with the area of the first storage electrode CstE1 in FIG. 14, and the minimized storage capacitor Cst is only formed by reducing the overlapping region.

In an embodiment, the predetermined value of the boost capacitors Cb1 and Cb2 is only formed in the normal pixel of the first display area DA1. In such an embodiment, only the parasitic capacitance value corresponding to the boost capacitors Cb1 and Cb2 may not match the display quality between two display areas DA1 and DA2, so that the boost capacitors Cb1 and Cb2 are formed in the normal pixel of the first display area DA1. In an embodiment, the variation pixel positioned in the second display area DA2 may have parasitic capacitance corresponding to the boost capacitors Cb1 and Cb2, however the first scan line 151 may be designed to be avoided to not increase the boost capacitors Cb1 and Cb2.

In an embodiment, as described above, by differentiating the values of the boost capacitors between the variation pixel and the normal pixel, the luminance displayed by the variation pixel of the second display area DA2 and the luminance displayed by the normal pixel of the first display area DA1 are controlled to match each other. In an embodiment, by minimizing the storage capacitor Cst in the variation pixel, or differentiating and designing the ratio (the Cpr/Cst ratio) of the capacitance value of the input capacitor Cpr for the capacitance value of the storage capacitor Cst depending on the color in the variation pixel, the luminance displayed by the variation pixel and the luminance displayed by the normal pixel may match each other. Through such luminance matching, the image displayed in the first display area DA1 and the image displayed in the second display area DA2 are not substantially different not to be distinguished by the user.

In an embodiment, in the normal pixel and the variation pixel, the capacitance value of the input capacitor Cpr is relatively large, which is for high speed driving. In such an embodiment, for high-speed driving, the input capacitor Cpr is desired to be large so that the data voltage $V_{DATA}$ may easily enter the pixel within a short time. In an embodiment, the capacitance of the input capacitor Cpr of the variation pixel is formed to be more than twice the capacitance value of the input capacitor Cpr of the normal pixel, so the luminance matching may be effective when being operated at a higher frequency.

Hereinafter, the arrangement structure of the driving unit in an embodiment will be described with reference to FIG. 21.

FIG. 21 is a block diagram showing a display device according to an embodiment.

Referring to FIG. 4 and FIG. 5, the number of control signals used for the normal pixel and the variation pixel is large. In order to generate such a control signal, the driving unit DR is desired to include various signal generators. In an embodiment, where the driving unit DR is disposed on opposing sides of the display device, all signal generators may be formed on both opposing sides, but in this case, the second second display area DA2-2 may be formed undesirably wide. Considering that the resolution of the second display area DA2 may be lower than that of the first display area DA1, forming a wider area of the driving unit DR causes display deterioration. Accordingly, in an embodiment, as shown in FIG. 21, the driving unit DR positioned on opposing sides is divided and disposed in the signal generator that is provided on opposing sides and the signal generator that may be provided only on one side among the driving unit DR on the opposing sides. As a result, the area occupied by the driving unit DR positioned on both sides may be substantially reduced or minimized.

Each signal generator includes a first light-emission control signal generator EM1_D that generates a first light-emission control signal EM1, a second light-emission control signal generator EM2_D that generates a second light-emission control signal EM2, an initialization control signal generator EB1_D that generates an initialization control signal EB1, a first scan signal generator GW_D that generates a first scan signal GW, and a second scan signal generator GC_D that generates a second scan signal GC.

According to FIG. 21, the signal generator provided in the driving unit DR positioned on opposing sides is the first scan signal generator GW_D, the first light-emission control signal generator EM1_D, and the second scan signal generator GC_D, and the signal generator provided only in the driving unit DR of one side is the second light-emission control signal generator EM2_D and the initialization control signal generator EB1_D.

First, in the driving unit DR of the second second display area DA2-2 positioned to the left of the display area DA, the initialization control signal generator EB1_D, the first light-emission control signal generator EM1_D, the second scan signal generator GC_D, and the first scan signal generator GW_D are disposed sequentially from the far left.

Also, in the driving unit DR of the second second display area DA2-2 positioned to the right of the display area DA, the second light-emission control signal generator EM2_D, the first light-emission control signal generator EM1_D, the second scan signal generator GC_D, and the first scan signal generator GW_D are formed disposed from the far right.

Referring to FIG. 21, the first scan signal generator GW_D is positioned at the closest position with respect to the display area DA, in the point that the second scan signal generator GC_D and the first light-emission control signal generator EM1_D are positioned to the outside from this, so the structure of the driving unit DR on opposing sides is the same as each other.

The output of the signal generator positioned at one row is applied together to the normal pixel and the variation pixel in a same row. That is, the driving unit for the normal pixel positioned in the first display area DA1 and the driving unit for the variation pixel positioned in the second display area DA2 are separately formed, thereby reducing the area occupied by the driving unit DR.

In an embodiment, as shown in FIG. 21, the quadrangle included in the same signal generator means the stage for the corresponding signal generator, the signal is not only generated in the corresponding stage to be applied to the pixel (the normal pixel, the variation pixel) of the display area DA, but also an operation of transmitting the output to the stage of the next row or the stage of the previous row may be performed together.

Referring to FIG. 21, among the signal generator, the first light-emission control signal generator EM1_D, the second scan signal generator GC_D, the second light-emission control signal generator EM2_D, and the initialization control signal generator EB1_D are provided one by one for two pixel rows. in an embodiment, where the first scan signal generator GW_D is provided one by one per one pixel row, the height of the second direction DR2 is shown to be small. Therefore, the number of the first scan signal generator GW_D may be two times the number of the other signal generator first light-emission control signal generator EM1_D, the second scan signal generator GC_D, the second light-emission control signal generator EM2_D, and the initialization control signal generator EB1_D.

Figure 22:
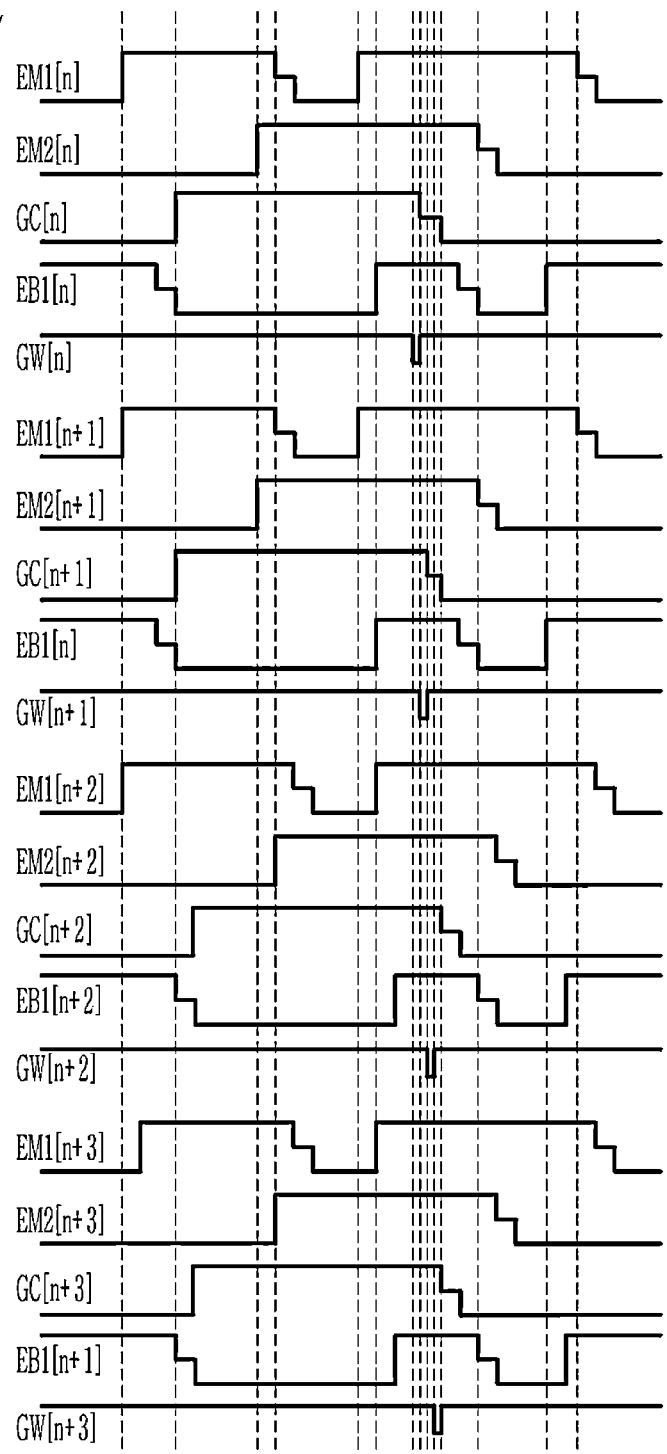
FIG. 22 is an operation timing diagram of each driving unit according to an embodiment.

In an embodiment, as above described, when the number of the first scan signal generator GW_D is different from the number of the other signal generator first light-emission control signal generator EM1_D, the second scan signal generator GC_D, the second light-emission control signal generator EM2_D, and the initialization control signal generator EB1_D, the timings applied to the adjacent pixels may be the same as that of FIG. 22.

FIG. 22 is an operation timing diagram of each driving unit according to an embodiment.

Referring to FIG. 22, the first scan signal GW[n] of the n-th pixel row and the first scan signal GW[n+1] of the (n+1)-th pixel row have the difference of 1H. The first scan signal generator GW_D may output the first scan signal GW[n] with an interval of 1H.

in an embodiment, the signals of the other signal generator first light-emission control signal generator EM1_D, the second scan signal generator GC_D, the second light-emission control signal generator EM2_D, and the initialization control signal generator EB1_D do not have the difference in the n-th pixel row and the (n+1)-th pixel row. Alternatively, the signal with the difference of 2H is transmitted to every two pixel rows. In one embodiment, for example, the first light-emission control signal EM[n] of the n-th pixel row and the first light-emission control signal EM[n+1] of the (n+1)-th pixel row have the same timing. alternatively, the first light-emission control signal EM[n+2] of the (n+2)-th pixel row and the first light-emission control signal EM[n+3] of the (n+3)-th pixel row have the difference of 2H from the first light-emission control signal EM[n] of the n-th pixel row and the first light-emission control signal EM[n+1] of the (n+1)-th pixel row. The control signal output from the first light-emission control signal generator EM1_D, the second scan signal generator GC_D, the second light-emission control signal generator EM2_D, and the initialization control signal generator EB1_D may be output with the 2H interval.

Hereinafter, the luminance matching in the display device according to an embodiment will be described with reference to FIG. 23.

Figure 23:
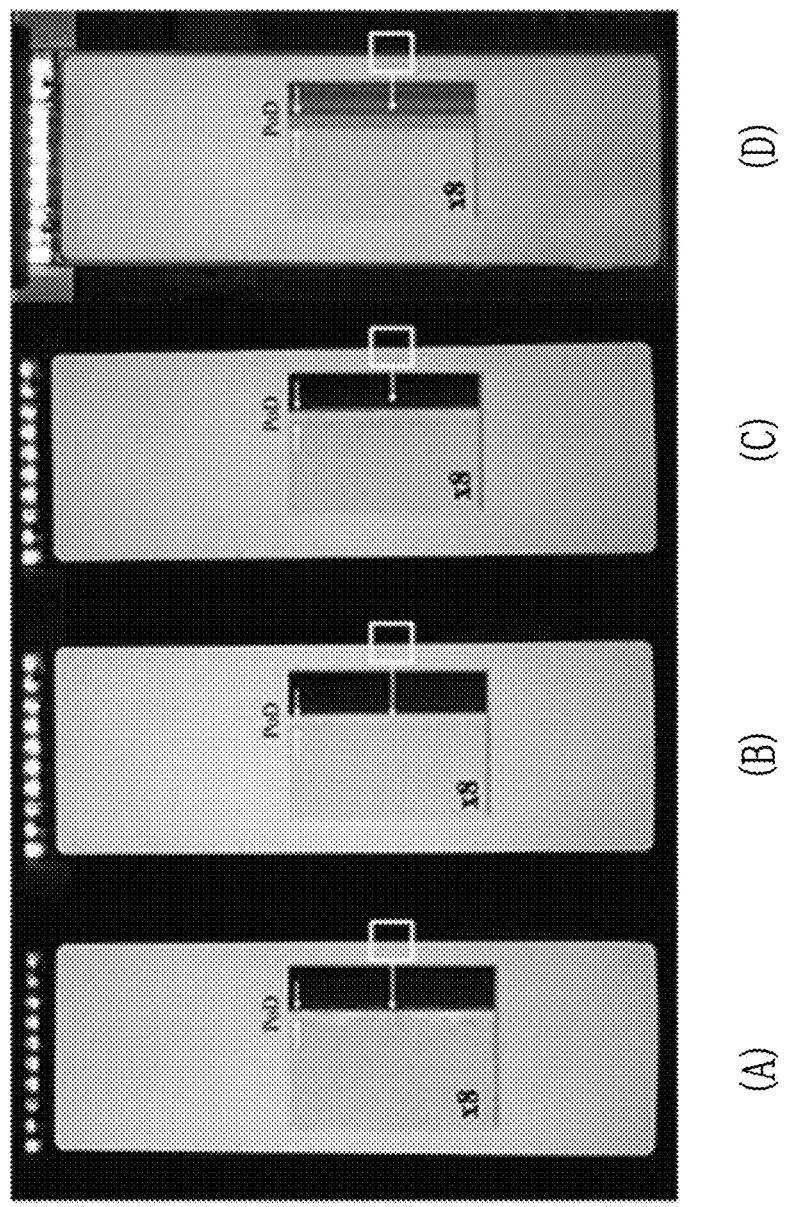
FIG. 23 is a view showing a display result of various conditions in a display device according to an embodiment.

FIG. 23 is a view showing a display result of various conditions in a display device according to an embodiment.

FIG. 23 shows the result confirming whether the display luminance of the normal pixel of the first display area DA1 and the display luminance of the variation pixel of the second display area DA2 are matched after displaying a specific luminance with various driving frequencies in an embodiment. The display device used in FIG. 23 is the display device to which FIG. 4, FIG. 5, FIG. 7, FIG. 20, and FIG. 21 are reflected.

FIG. 23 (A) shows a case to display an image with the luminance of 900 nit at 120 hertz (Hz). FIG. 23 (A) shows an enlarged quadrangle region in the display device. Also, in FIG. 23, the width indicated by PoD represents the second display area DA2. Referring to the enlarged region in FIG. 23 (A), it may be confirmed that the display luminance of the variation pixel of the second display area DA2 is displayed brighter. However, since the area of the second display area DA2 is narrow, it may be difficult for the user to recognize the area of the second display area DA2 to be brighter, and the display quality may not be impaired.

FIG. 23 (B) shows a case to display an image with luminance of 305 nit at 120 Hz. Referring to the enlarged part in FIG. 23 (B), it may be confirmed that there is no noticeable difference. As a result, it may be confirmed that the display luminance of the variation pixel of the second display area DA2 matches the display luminance of the normal pixel of the first display area DA1. It may be confirmed that even at a high frequency of 120 Hz, the luminance matching is possible without impairing the display quality.

FIG. 23 © shows a case of being operated with a low frequency of 1 Hz. That is, it is a case in which a luminance of 315 nit is displayed at 1 Hz, and referring to the enlarged part shown in FIG. 23 (C), it may be confirmed that there is no noticeable difference. As a result, in an embodiment, the display luminance of the variation pixel of the second display area DA2 matches the display luminance of the normal pixel of the first display area DA1. It may be confirmed that even at a low frequency of 1 Hz, the luminance matching is possible without impairing the display quality.

FIG. 23 (D) is a case of displaying an image with the luminance of 21 nit at 120 Hz as a case displaying a low luminance. Referring to the enlarged part in FIG. 23 (D), it may be confirmed that the luminance is not matched and the display luminance of the variation pixel of the second display area DA2 is lower than the display luminance of the normal pixel of the display area DA1.

As shown in FIG. 23, according to an embodiment, the luminance matching is possible even while driving the display device with a low frequency, and the luminance matching is possible even while driving the display device with high frequency. In such an embodiment, the luminance matching is highly effective in the middle gray range. Accordingly, the display quality may be improved by forming the boost capacitor differently in the normal pixel and in the variation pixel compared with a conventional display device where the luminance matching in the medium gray at both high and low frequency driving are not effectively achieved.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A light emitting display device comprising:
   a first display area including a first light-emitting element and a first pixel circuit unit which drives the first light-emitting element and overlaps the first light-emitting element; and
   a second display area including a second light-emitting element and a second pixel circuit unit which drives the second light-emitting element and does not overlap the second light-emitting element,
   wherein a pixel density in the first display area is greater than a pixel density in the second display area,
   wherein each of the first pixel circuit unit and the second pixel circuit unit includes:
   a first transistor which generates an output current, wherein the first transistor is a driving transistor;
   a second transistor which receives a data voltage from a data line;
   a third transistor which transmits the data voltage output from the second transistor to a gate electrode of the first transistor;
   a fifth transistor which transmits a driving voltage to the first transistor; and
   a sixth transistor which transmits the output current output from the first transistor to the first light-emitting element or the second light-emitting element, and
   wherein the first pixel circuit unit further includes a first boost capacitor connected between a scan signal line and an electrode of the first transistor, and a second boost capacitor connected between the scan signal line and another electrode of the first transistor.

2. The light emitting display device of claim 1, further comprising:
   a driving unit which transmits a signal to the first pixel circuit unit and the second pixel circuit unit.

3. The light emitting display device of claim 2, wherein the second light-emitting element is disposed over the driving unit.

4. The light emitting display device of claim 3, further comprising:
   a third light-emitting element disposed in the second display area and overlapping the second pixel circuit unit.

5. The light emitting display device of claim 4, further comprising:
   a third pixel circuit unit which drives the third light-emitting element and does not overlap the third light-emitting element.

6. The light emitting display device of claim 4, wherein the third light-emitting element is disposed between the first light-emitting element and the second light-emitting element.

7. The light emitting display device of claim 2, wherein the driving unit includes:
   a first scan signal generator which generates a first scan signal;
   a second scan signal generator which generates a second scan signal;
   a first light-emission control signal generator which generates a first light-emission control signal;
   a second light-emission control signal generator which generates a second light-emission control signal; and
   an initialization control signal generator generating an initialization control signal.

8. The light emitting display device of claim 7, wherein the driving unit disposed at one side among opposing sides of the first display area includes the first scan signal generator, the second scan signal generator, the first light-emission control signal generator, and the initialization control signal generator, and
   the driving unit disposed at another side among the opposing sides of the first display area includes the first scan signal generator, the second scan signal generator, the first light-emission control signal generator, and the second light-emission control signal generator.

9. The light emitting display device of claim 1, wherein one electrode of the first boost capacitor is connected to the scan signal line which is connected to a gate electrode of the second transistor, and another electrode of the first boost capacitor is connected to the gate electrode of the first transistor.

10. The light emitting display device of claim 9, wherein each of the first pixel circuit unit and the second pixel circuit unit further includes:
    a storage capacitor connected to the gate electrode of the first transistor.

11. The light emitting display device of claim 9, wherein one electrode of the second boost capacitor is connected to the scan signal line and another electrode of the second boost capacitor is connected to a node to which the first transistor and the sixth transistor are connected.

12. The light emitting display device of claim 1, wherein each of the first pixel circuit unit and the second pixel circuit unit further includes:

a seventh transistor which applies an initialization voltage to an anode of the first light-emitting element or the second light-emitting element.

13. The light emitting display device of claim 1, wherein the third transistor includes an oxide semiconductor.

14. A light emitting display device comprising:
a first display area including a first light-emitting element and a first pixel circuit unit which drives the first light-emitting element and overlaps the first light-emitting element; and
a second display area including a second light-emitting element and a second pixel circuit unit which drives the second light-emitting element and does not overlap the second light-emitting element,
wherein a pixel density in the first display area is greater than a pixel density in the second display area,
wherein each of the first pixel circuit unit and the second pixel circuit unit includes:
a first transistor which generates an output current, wherein the first transistor is a driving transistor;
a second transistor which receives a data voltage from a data line; and
a third transistor which transmits the data voltage output from the second transistor to a gate electrode of the first transistor,
wherein the first pixel circuit unit further includes a first boost capacitor,
wherein one electrode of the first boost capacitor is connected to a first scan line connected to a gate electrode of the second transistor, and another electrode of the first boost capacitor is connected to the gate electrode of the first transistor,
wherein the third transistor includes an oxide semiconductor, and
wherein the first boost capacitor includes a first boost electrode overlapping the first scan line and disposed in a same layer as the oxide semiconductor.

15. The light emitting display device of claim 14, wherein
the third transistor is turned on when a high level voltage is applied to the gate electrode, and
the second transistor and the first transistor are turned on when a low level voltage is applied to the gate electrode.

16. The light emitting display device of claim 14, further comprising:
a driving unit which transmits a signal to the first pixel circuit unit and the second pixel circuit unit, the driving unit including:
a first scan signal generator which generates a first scan signal;
a second scan signal generator which generates a second scan signal;
a first light-emission control signal generator which generates a first light-emission control signal;
a second light-emission control signal generator which generates a second light-emission control signal; and
an initialization control signal generator generating an initialization control signal.

17. The light emitting display device of claim 16, wherein
the driving unit disposed at one side among opposing sides of the first display area includes the first scan signal generator, the second scan signal generator, the first light-emission control signal generator, and the initialization control signal generator, and
the driving unit disposed at another side among the opposing sides of the first display area includes the first scan signal generator, the second scan signal generator, the first light-emission control signal generator, and the second light-emission control signal generator.

18. The light emitting display device of claim 16, wherein
the second scan signal generator, the first light-emission control signal generator, the second light-emission control signal generator, and the initialization control signal generator are provided one by one per two pixel rows, and
the first scan signal generator is provided one by one for one pixel row.

19. The light emitting display device of claim 18, wherein
the first scan signal generator outputs the first scan signal at an interval of one horizontal period.

20. The light emitting display device of claim 19, wherein
the signal output from the second scan signal generator, the first light-emission control signal generator, the second light-emission control signal generator, and the initialization control signal generator is output with an interval of two horizontal periods.

* * * * *